(12) United States Patent
Yajima et al.

(10) Patent No.: US 9,576,921 B2
(45) Date of Patent: Feb. 21, 2017

(54) SEMICONDUCTOR DEVICE AND MANUFACTURING METHOD FOR THE SAME

(71) Applicant: RENESAS ELECTRONICS CORPORATION, Koutou-ku, Tokyo (JP)

(72) Inventors: Akira Yajima, Hitachinaka (JP); Seiji Muranaka, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/952,468

(22) Filed: Nov. 25, 2015

(65) Prior Publication Data

US 2016/0163666 A1    Jun. 9, 2016

(30) Foreign Application Priority Data

Dec. 4, 2014    (JP) ................................. 2014-246296

(51) Int. Cl.
*H01L 23/00*    (2006.01)

(52) U.S. Cl.
CPC ............... *H01L 24/08* (2013.01); *H01L 24/02* (2013.01); *H01L 24/03* (2013.01); *H01L 24/48* (2013.01); *H01L 24/85* (2013.01); *H01L 24/45* (2013.01); *H01L 2224/023* (2013.01); *H01L 2224/024* (2013.01); *H01L 2224/02317* (2013.01); *H01L 2224/033* (2013.01); *H01L 2224/45144* (2013.01); *H01L 2224/45147* (2013.01);

(Continued)

(58) Field of Classification Search
CPC .................................. H01L 24/03; H01L 24/08
USPC .......................................................... 257/773
See application file for complete search history.

(56) References Cited

U.S. PATENT DOCUMENTS

2006/0103020 A1*  5/2006  Tong ................... H01L 23/3114
                                                           257/738
2007/0126109 A1   6/2007  Hashimoto
                        (Continued)

FOREIGN PATENT DOCUMENTS

JP    2001-053075 A    2/2001
JP    2003-218278 A    7/2003
                   (Continued)

*Primary Examiner* — Kenneth Parker
*Assistant Examiner* — Warren H Kilpatrick
(74) *Attorney, Agent, or Firm* — Shapiro, Gabor and Rosenberger, PLLC

(57) ABSTRACT

To improve an integration degree of a semiconductor device. The semiconductor device includes a plurality of wiring layers formed on the semiconductor substrate, a pad electrode formed on an uppermost wiring layer among the plurality of wiring layers, a base insulating film having a pad opening above the pad electrode, and a rewiring electrically connected to the pad electrode and extending over the base insulating film. Further, the semiconductor device includes a protective film covering an upper surface of the rewiring and having an external pad opening exposing part of the upper surface of the rewiring, an external pad electrode electrically connected to the rewiring through the external pad opening and extending over the protective film, and a wire connected to the external pad electrode. Part of the external pad electrode is located in a region outside the rewiring.

19 Claims, 19 Drawing Sheets

(52) U.S. Cl.
CPC ......... *H01L 2224/4807* (2013.01); *H01L 2224/85345* (2013.01); *H01L 2924/181* (2013.01)

(56) References Cited

U.S. PATENT DOCUMENTS

| | | | | |
|---|---|---|---|---|
| 2007/0251721 | A1* | 11/2007 | Kiuchi | H01L 23/49894 174/258 |
| 2011/0304049 | A1* | 12/2011 | Shigihara | H01L 23/53238 257/762 |
| 2012/0319270 | A1* | 12/2012 | Chen | H01L 23/562 257/737 |
| 2013/0026658 | A1* | 1/2013 | Chen | H01L 23/3192 257/784 |

FOREIGN PATENT DOCUMENTS

| | | |
|---|---|---|
| JP | 2007-158043 A | 6/2007 |
| JP | 2012-004210 A | 1/2012 |

\* cited by examiner

SEMICONDUCTOR DEVICE AND MANUFACTURING METHOD FOR THE SAME

CROSS-REFERENCE TO RELATED APPLICATION

The present application claims priority from Japanese Patent Application No. 2014-246296 filed on Dec. 4, 2014, the content of which is hereby incorporated by reference into this application.

TECHNICAL FIELD OF THE INVENTION

The present invention relates to a semiconductor device and a manufacturing method for the same and relates particularly to a technique effectively applied to a semiconductor device having a rewiring composed of a metal film that is formed above a plurality of wiring layers formed on the main surface of a semiconductor substrate and to a manufacturing method for the semiconductor device.

BACKGROUND OF THE INVENTION

A semiconductor device is structured such that, for example, above a semiconductor substrate having a semiconductor element such as a CMIS (Complementary Metal Insulator Semiconductor) FET formed thereon, a multilayer wiring is formed by a metal film mainly made of, for example, Cu (copper) or Al (aluminum) and that a final passivation film is formed above the multilayer wiring.

Japanese Patent Application Publication Laid-Open No. 2001-53075 (Patent Document 1) discloses a structure shown in FIG. 3 in which a wire 22 serving as an external terminal is connected to a wiring layer 17 having the surface coated with a nickel/gold or nickel/palladium coating layer 18.

Japanese Patent Application Publication Laid-Open No. 2003-218278 (Patent Document 2) discloses a structure described in the summary in which a rewiring conductor has an external electrode 6 formed thereon, which is almost pillar-like and has a stress relaxing function.

Japanese Patent Application Publication Laid-Open No. 2007-158043 (Patent Document 3) discloses a structure shown in FIG. 3 in which a wiring 16 connected to a first electrode 11 is extended over a stress relaxing layer 15, on which an external terminal 12 formed as a solder ball is connected to the wiring 16.

Japanese Patent Application Publication Laid-Open No. 2012-4210 (Patent Document 4) discloses a structure shown in FIG. 25 in which a pad 18 composed of an Ni film 18a and an Au film 18b that are stacked together is disposed on the surface of a rewiring 15 and is connected to a wire 20.

SUMMARY OF THE INVENTION

Problems found through examinations by the inventor of the invention as claimed herein will be described, referring to Patent Document 4.

As shown in FIGS. 24 and 25 of Patent Document 4, the wire 20 is connected to the pad 18 formed on the upper surface of the rewiring 15, and at the connecting part of the wire 20, the rewiring 15 has a wide plane shape. This is because that the wire 20, even if it is a thin wire, usually has a diameter of about 30 μm, as a result of which, after bonding is completed, the diameter of a wire ball on a bonding part turns out to be about 60 to 80 μm. This means that the pad 18, i.e., the connecting part of the wire 20, must be formed into a square with each side of, for example, 80 to 100 μm long. Hence the rewiring 15, on which the pad 18 is mounted, needs an area as large as the pad 18 (wide area).

It is a general principle that the rewiring 15 has resistance lower than that of Al wirings 5, 7, and 9 below the rewiring 15. The rewiring 15 is, therefore, composed of a film thickness of about 10 μm using a copper film of low resistance.

The above facts put limitations on efforts for realizing rewirings disposed at fine pitches and therefore intervals between rewirings adjacent to each other end up in large one. The above facts also bring a need of properly disposing rewirings adjacent to each other, by avoiding a wide wire connecting part. These problems lead to a conclusion that high-density integration (miniaturization) of a semiconductor device having rewirings is difficult.

The object of the present invention is to provide a technique for realizing high-density integration (miniaturization) of a semiconductor device having rewirings.

The above described and other objects and novel features of the invention will be clear from the description of the specification and the accompanying drawings.

A semiconductor device according to an embodiment of the present invention includes: a plurality of wiring layers formed on a semiconductor substrate; a pad electrode formed on an uppermost wiring layer among the plurality of wiring layers; an insulating film having a first opening above the pad electrode; and a rewiring electrically connected to the pad electrode and extending over the insulating film. Further, the semiconductor device includes: a protective film covering an upper surface of the rewiring, and having a second opening exposing part of the upper surface of the rewiring; an external pad electrode electrically connected to the rewiring through the second opening and extending over the protective film; and a wire connected to the external pad electrode. When seen in a plan view, part of the external pad electrode is located in a region outside the rewiring.

According to an embodiment of the present invention, it is possible to realize high-density integration of a semiconductor device having rewirings.

BRIEF DESCRIPTIONS OF THE DRAWINGS

DESCRIPTIONS OF THE PREFERRED EMBODIMENTS

Figure 1:
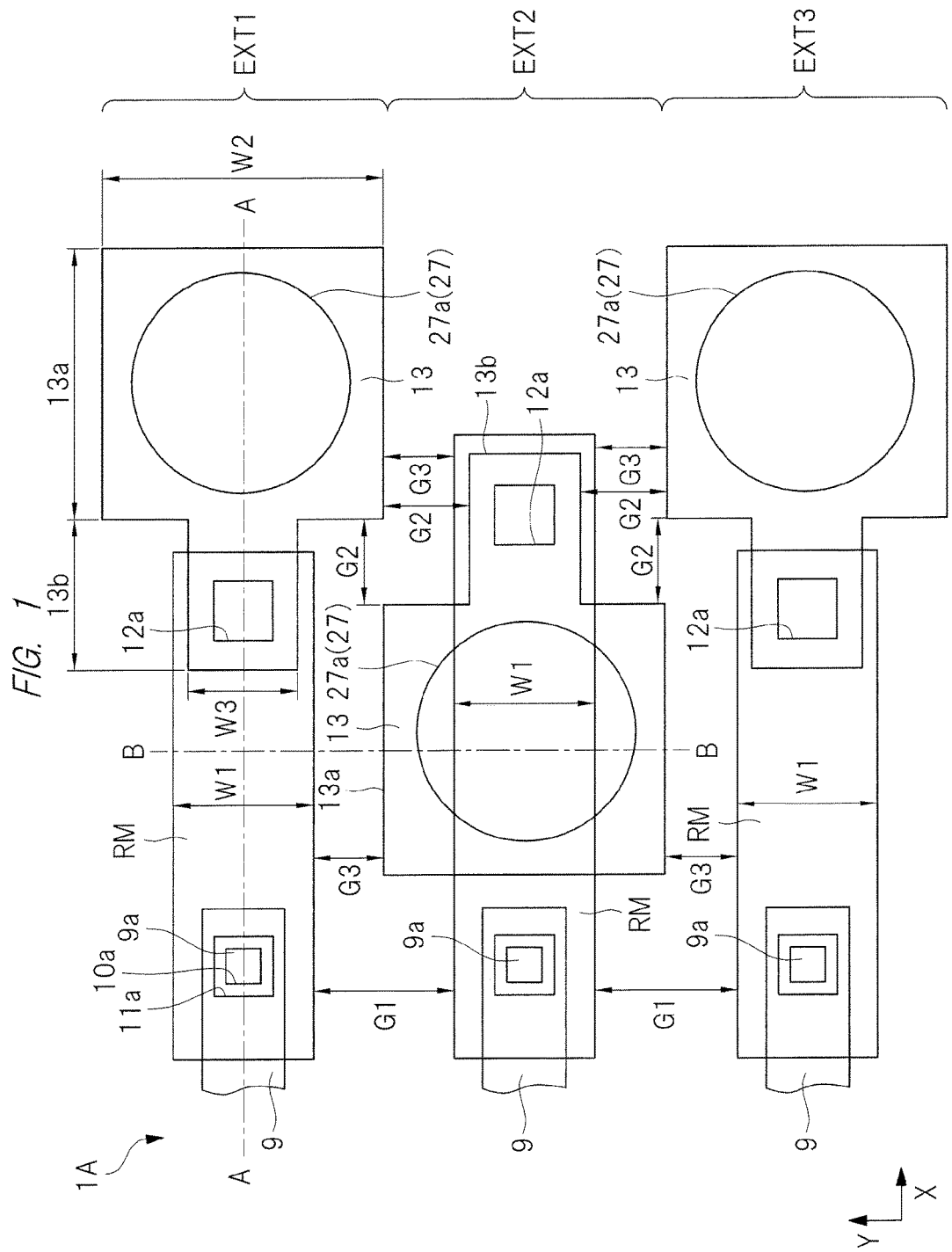
FIG. 1 is a plan view of main parts of a semiconductor device according to an embodiment.

In the following embodiment, when there is the necessity for convenience, the explanation will be divided into plural sections or plural embodiments. However, unless otherwise specified, they are not irrelevant with each other but they have a relationship that one is a modified example, an application, detailed explanation, and supplementary explanation of a part or all of the other. In the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following embodiment, a component (including an element step etc.) referred to is not always essential, except for the case where it is specified in particular or clearly considered to be essential in principle. Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

Hereinafter, embodiments of the present invention will be explained in detail with reference to the accompanying drawings. In the entire diagrams for explaining the embodiments of the present invention, the same or a related symbol is attached to the member which has the same function, and the repeated explanation thereof is omitted. When plural similar members (regions) exist, an individual or specific region may be indicated by adding a mark to the symbol of a generic name. In the following embodiments, except when necessary in particular, the repeated explanation of the same or a similar part is omitted in principle.

In a drawing employed in the embodiments, even if it is a sectional view, hatching may be omitted in order to make the drawing easier to see. Even if the drawing is a plan view, hatching may be attached on the contrary in order to make the drawing easier to see.

In a sectional view and a plan view, the size of each region does not correctly correspond to an actual device, and a specific region may be displayed relatively larger in order to make the drawing easier to see. Even when a plan view and a sectional view correspond to each other, each region may be displayed in a different size.

Embodiment

A semiconductor device (semiconductor integrated circuit device) according to the present embodiment includes a semiconductor chip having, for example, a plurality of semiconductor elements, a plurality of layers of wirings (multilayer wiring) formed above the plurality of semiconductor elements, and a plurality of rewirings connected to the uppermost wiring among the plurality of layers of wirings. The plurality of semiconductor elements are interconnected via the multilayer wiring or the plurality of rewirings. A semiconductor device 1A according to the present embodiment will be described.

<Semiconductor Device>

Figure 2:
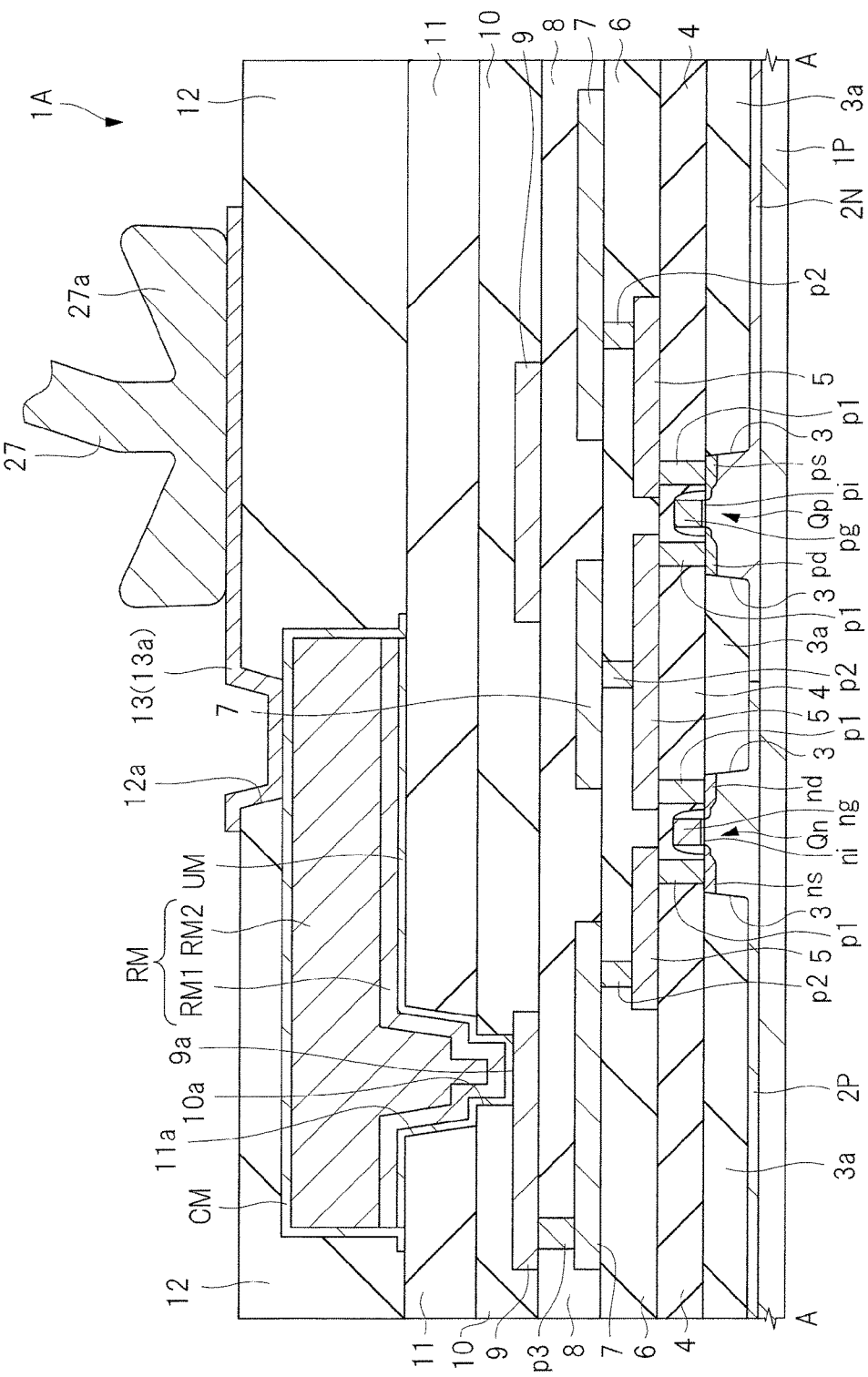
FIG. 2 is a cross-sectional view of main parts that is taken along an A-A line of FIG. 1.
Figure 3:
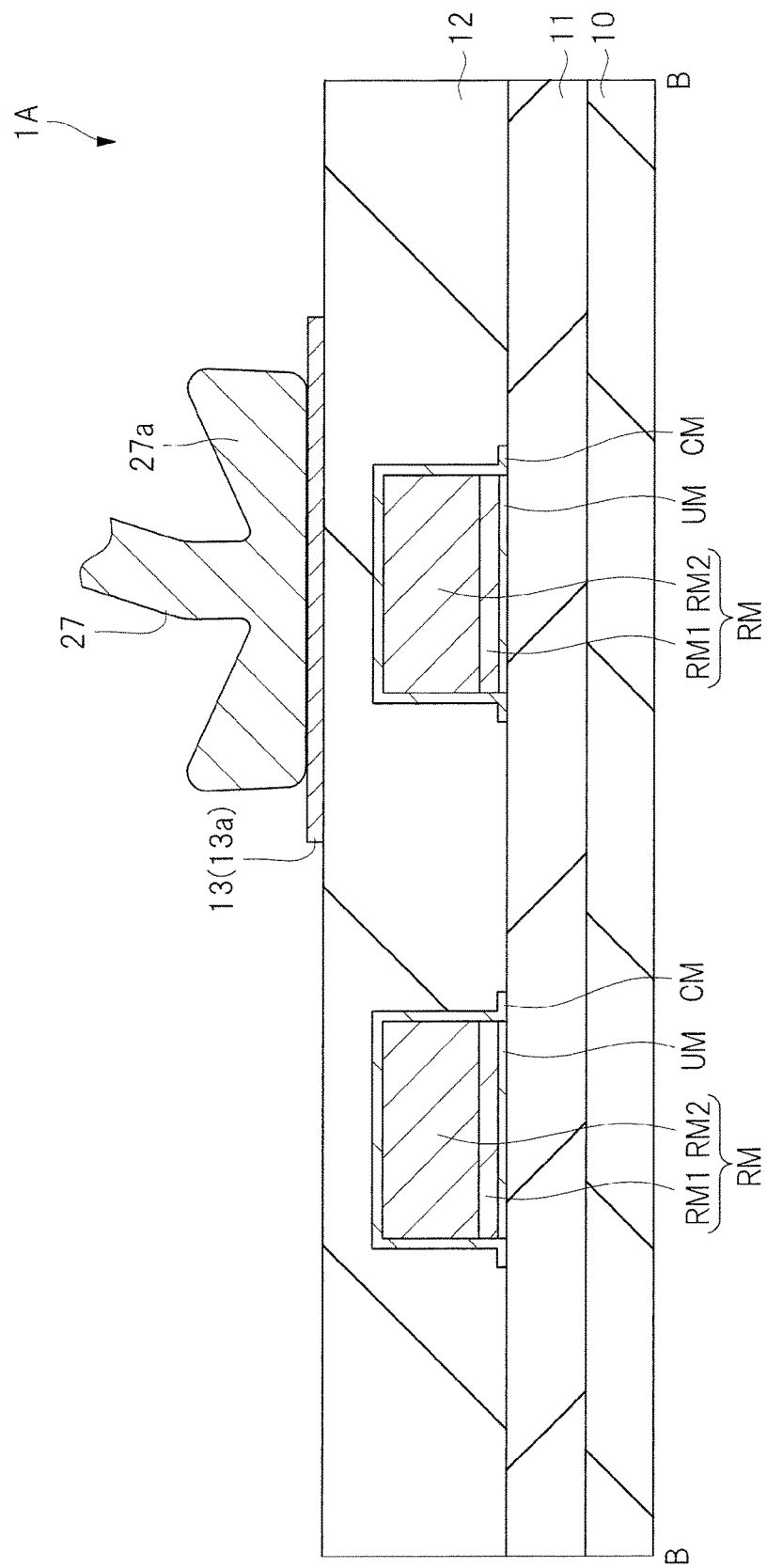
FIG. 3 is a cross-sectional view of main parts that is taken along a B-B line of FIG. 1.

FIG. 1 is a plan view of the main parts of a semiconductor device according to the present embodiment. FIG. 2 is a cross-sectional view of the main parts that is taken along an A-A line of FIG. 1. FIG. 3 is a cross-sectional view of the main parts that is taken along a B-B line of FIG. 1.

FIG. 1 shows three external terminals EXT1, EXT2, and EXT3 included in the semiconductor device 1A. These external terminals are terminals for applying signals, source voltages, or reference voltages to the semiconductor device 1A. Each of the three external terminals EXT1, EXT2, and EXT3 has a third layer Al (aluminum) wiring 9, a rewiring RM, and an external pad electrode 13. The third layer Al wiring 9 is electrically connected to the external pad electrode 13 via the rewiring RM. The external terminals EXT1, EXT2, and EXT3 are terminals through which the semiconductor device 1A is electrically connected to external elements. A wire 27 is connected to the external pad electrode 13. FIG. 1 shows a ball portion 27a serving as a connecting part between the wire 27 and the external pad electrode 13.

The external terminal EXT1 of FIG. 1 has, for example, the rewiring RM with a width W1 that extends in the X direction (horizontal direction) in the drawing. The rewiring RM has one end connected to a pad electrode 9a on the upper surface (surface) of the third layer Al wiring 9 and the other end connected to the external pad electrode 13 through an external pad opening 12a. The external pad electrode 13 is composed of a ball connecting portion 13a to which the ball portion 27a of the wire 27 is connected, and a projecting portion 13b for securing electrical connection to the rewiring RM. Both ball connecting portion 13a and projecting portion 13b are almost rectangular. The projecting portion 13b overlaps the rewiring RM, but the ball connecting portion 13a is outside the rewiring RM and therefore does not overlap the rewiring RM. The width W2 of the ball connecting portion 13a in the Y direction (vertical direction) in the drawing perpendicular to a extending direction of the rewiring RM is larger than the width W3 of the projecting portion 13b (W2>W3). The width W2 of the ball connecting portion 13a is larger than the width W1 of the rewiring RM (W2>W1). Outside the rewiring RM means a region where no rewiring RM is formed.

The external terminal EXT2 will then be described. The rewiring RM making up the external terminal EXT2 with the width W1 that extends in the X direction in the drawing. Similar to the case of the external terminal EXT1, the rewiring RM has one end connected to the pad electrode 9a on the upper surface (surface) of the third layer Al wiring 9 and the other end connected to the external pad electrode 13 through the external pad opening 12a. The external pad electrode 13 is identical in structure with the external terminal EXT1, but is different in that the locations of the ball connecting portion 13a and projecting portion 13b are reverse to those of the ball connecting portion 13a and projecting portion 13b of the external terminal EXT1. As a result, both of the ball connecting portion 13a and projecting portion 13b overlap the rewiring RM. Since the width W2 of the ball connecting portion 13a is larger than the width W1 of the rewiring RM, part of the ball connecting portion 13a as well as part of the ball portion 27a protrudes outside the rewiring RM.

The rewiring RM of the external terminal EXT2 and the rewiring RM of the external terminal EXT1 are disposed in parallel with each other with a gap G1. The external pad electrode 13 of the external terminal EXT1 and the external pad electrode 13 of the external terminal EXT2 are disposed close to each other in the X and Y directions with respective gaps G2. The gap G2 is smaller than the gap G1 (G2<G1). In this manner, by disposing the ball connecting portions 13a of external terminals EXT1 and EXT2 reverse to each other with respect to the external pad opening 12a, the external terminal EXT1 and the external terminal EXT2 can be disposed close to each other in the Y direction.

In an assumed case where the external pad electrodes 13 of the external terminals EXT1 and EXT2 are completely located on the rewirings RM, respectively (which means the rewirings RM and external pad electrodes 13 belong to the same layer), a gap between the external pad electrode 13 of the external terminal EXT1 and the external pad electrode 13 of the external terminal EXT2 must be widened. This results in an increase in the size in the Y direction of the external terminals EXT1 and EXT2. According to the present embodiment, the external pad electrode 13 belongs to a layer different from a layer to which the rewiring RM belongs. This allows miniaturization of the external terminal.

In addition, a gap G3 in the Y direction between the rewiring RM of the external terminal EXT1 and the external pad electrode 13 of the external terminal EXT2 adjacent to the external terminal EXT1 can be made smaller than the gap G1. As a result, the external terminals EXT1 and EXT2 can be disposed close to each other in the Y direction.

The external terminal EXT3 is identical in structure with the external terminal EXT1, and the rewiring RM of the external terminal EXT3 is in parallel with the rewiring RM of the external terminal EXT2 and extends in the X direction with the gap G1. The external pad electrode 13 of the external terminal EXT2 and the external pad electrode 13 of the external terminal EXT3 are disposed close to each other with the gap G3. The relation between the external terminal EXT1 and the external terminal EXT2 is, therefore, the same as the relation between the external terminal EXT2 and the external terminal EXT3.

As shown in FIG. 2, the semiconductor device 1A mainly includes an n-channel type MISFET (Metal Insulator Semiconductor Field-Effect Transistor) Qn, a p-channel type MISFET Qp, a plurality of layers of wirings 5, 7, and 9, the rewiring RM, and the external pad electrode 13.

As shown in FIG. 2, a p-type well 2P, an n-type well 2N, and element isolation trenches 3 are formed on a semiconductor substrate 1P made of, for example, p-type single-crystal silicon. Each element isolation trench 3 is filled with, for example, an element isolation insulating film 3a made of silicon oxide.

In the p-type well 2P, the n-channel type MISFET Qn is formed, which is a semiconductor element. The n-channel type MISFET Qp is formed in an active region defined by the element isolation trenches 3, and has a source region ns and a drain region nd which are formed in the p-type well 2P, and a gate electrode ng formed above the p-type well 2P via a gate insulating film ni. In the n-type well 2N, the p-channel type MISFET Qp is formed, which is a semiconductor element. The p-channel type MISFET Qp has a source region ps, a drain region pd, and a gate electrode pg formed above the n-type well 2N via a gate insulating film pi.

Above the n-channel type MISFET Qn and p-channel type MISFET Qp, wirings composed of metal films interconnecting the semiconductor elements are formed. In general, the wirings interconnecting the semiconductor elements are provided as a multilayer wiring structure composed of three to ten layers of wirings. FIG. 2 shows three layers of wirings, i.e., wiring layers (first layer Al wiring 5, second layer Al wiring 7, third layer Al wiring 9) each composed of a metal film mainly made of aluminum alloy, as an example of the multilayer wiring structure. Here, a term of a wiring layer is used when collectively referring to a plurality of wirings formed by each of the wiring layers. These wiring layers have their respective thicknesses such that the second wiring layer is thicker than the first wiring layer and that the third wiring layer is thicker than the second wiring layer.

Between the n-channel type MISFET Qn/p-channel type MISFET Qp and the first layer Al wiring 5, between the first layer Al wiring 5 and the second layer Al wiring 7, and between the second layer Al wiring 7 and the third layer Al wiring 9, inter-layer insulating films 4, 6, and 8 each made of silicon oxide, etc., and plugs P1, p2, and p3 via which those three layers of wirings are electrically connected are formed, respectively.

The inter-layer insulating film 4 is formed on the semiconductor substrate 1P such that, for example, the inter-layer insulating film 4 covers the semiconductor elements. The first layer Al wiring 5 is formed on the inter-layer insulating film 4. The first layer Al wiring 5 is electrically connected to the source region ns, drain region nd, and gate electrode ng of the n-channel type MISFET Qn, which is a semiconductor element via, for example, plugs p1 formed on the inter-layer insulating film 4. The first layer Al wiring 5 is electrically connected also to the source region ps, drain region pd, and gate electrode pg of the p-channel type MISFET Qp, which is a semiconductor element via, for example, plugs p1 formed on the inter-layer insulating film 4. Connections between the gate electrodes ng and pg and the first layer Al wiring 5 are not illustrated.

The second layer Al wiring 7 is electrically connected to the first layer Al wiring 5 via, for example, plugs p2 formed on the inter-layer insulating film 6. The third layer Al wiring 9 is electrically connected to the second layer Al wiring 7 via, for example, plugs p3 formed on the inter-layer insulating film 8. The plugs p1, p2, and p3 are each composed of a metal film, e.g., W (tungsten) film.

It is obvious that when the multilayer wiring (three layers of wiring) is formed by a metal film mainly made of copper by chemical mechanical polishing (CMP), dual damascene for forming wirings and plugs together may be employed. The inter-layer insulating films 4, 6, and 8 are each made of silicon oxide ($SiO_2$). Obviously, each of the inter-layer insulating films 4, 6, and 8 may be provided as a single-layer film of silicon oxide containing carbon (SiOC), silicon oxide containing nitrogen and carbon (SiCON), or silicon oxide containing fluorine (SiOF) or as a stacked film of these substances.

On the third layer Al wiring 9 which is the uppermost wiring layer among the wiring layers making up the multilayer wiring, for example, a surface protective film (protective film, insulating film) 10, which is a single-layer film such as silicon oxide film or a silicon nitride film, or a two-layer film composed of these two films, is formed as a final passivation film. The third layer Al wiring 9 which is the uppermost wiring layer exposed on the bottom of a pad opening (opening) 10a formed on the surface protective film 10 and makes up a pad electrode (electrode pad, first electrode pad) 9a, which is an aluminum pad.

The third layer Al wiring 9 makes up not only the pad electrode 9a but also, for example, a wiring formed integrally with the pad electrode 9a and a wiring not connected to the pad electrode 9a. A wiring not connected to the pad electrode 9a is used as a wiring that electrically interconnects semiconductor elements or circuits to make up the semiconductor integrated circuit.

On the surface protective film 10, a base insulating film (organic protective film, insulating film) 11 is formed, which is an insulating film having an opening 11a above the pad opening 10a. On the base insulating film 11, the rewiring RM is formed, which is electrically connected to the pad electrode 9a through the opening 11a of the base insulating film 11 and the pad opening 10a of the surface protective film 10. The opening 11a is larger than the pad opening 10a, so that along the entire periphery of the pad opening 10a, the upper surface (surface) of the surface protective film 10 defining the pad opening 10a is exposed from the opening 11a. The rewiring RM is formed inside the pad opening 10a and opening 11a so as to completely fill up the pad opening 10a and opening 11a, and is extended over the base insulating film 11.

A base metal film UM is interposed between the pad electrode 9a and the rewiring RM. The base metal film UM is in contact with the pad electrode 9a and is electrically connected thereto. In the pad opening 10a of the surface protective film 10 and the opening 11a of the base insulating film 11, the base metal film UM is formed along the side faces (side walls) and upper surface of the surface protective film 10 and along the side faces (side walls) of the base insulating film 11, and is extended over the upper surface of the base insulating film 11. The base metal film UM has an upper surface and a lower surface, the upper surface being in contact with the rewiring RM and the lower surface being in contact with the pad electrode 9a, the surface protective film 10, and the base insulating film 11. The base metal film UM is provided as a single-layer film of chromium (Cr), titanium (Ti), titanium nitride (TiN), or tungsten nitride (WN) or as a stacked film of these substances. The base metal film UM functions also as a diffusion barrier film that prevents diffusion of copper (Cu) making up the rewiring RM.

The rewiring RM has an upper surface, a lower surface, and side faces. The lower surface of the rewiring RM is in contact with the upper surface of the base metal film UM. The rewiring RM is a copper film mainly made of copper and has a stacked structure consisting of a seed film RM1 and a plating film RM2. The lower surface of the rewiring RM, therefore, means the lower surface of the seed film RM1 and the upper surface of the same means the upper surface of the plating film RM2. The side faces (side walls) of the rewiring RM means the side faces (side walls) of the stacked structure consisting of the seed film RM1 and the plating film RM2. The seed film RM1 and the plating film RM2 are 250 nm and 6 μm in thickness, respectively. The third layer Al wiring 9, on the other hand, is 400 nm to 600 nm in thickness. The rewiring RM is, therefore, a low-resistance wiring having a film thickness of 10 times or more than the film thickness of the third layer Al wiring 9, i.e., the wiring 9 on which the pad electrode 9a is formed. In short, the film thickness of the rewiring RM is larger than that of the wiring 9 on which the pad electrode 9a is formed. It is desirable that the film thickness of the rewiring RM be 10 times or more than that of the wiring 9 on which the pad electrode 9a is formed.

A cap metal film CM is formed such that it is in contact with the upper surface and side faces of the rewiring RM to completely cover the rewiring RM. The cap metal film CM covers the whole of the upper surface and side faces of the rewiring RM, thus completely covering the side faces (side walls) of the seed film RM1 making up the rewiring RM and the side faces (side walls) of the plating film RM2. The cap metal film CM has an upper surface and a lower surface, the lower surface being in contact with the upper surface and side faces of the rewiring RM, and in directly contact with the upper surface of the base insulating film 11 in a region outside the rewiring RM (region where no rewiring RM is formed).

The cap metal film CM is made of, for example, any one of titanium (Ti), Chromium (Cr), nickel (Ni), titanium nitride (TiN), etc. The cap metal film CM functions also as a diffusion barrier film that prevents diffusion of the copper making up the rewiring RM.

A protective film 12 is formed so as to cover the whole of the rewiring RM. The protective film 12 has an opening 12a from which the upper surface of the rewiring RM (more precisely, the upper surface of the cap metal film CM) is partially exposed. Each of the base insulating film 11 and the protective film 12 is provided as an organic film, such as polyimide-based resin film, benzocyclobutene-based resin film, acrylic resin film, epoxy resin film, and silicon-based resin film.

The external pad electrode 13 is connected to the rewiring RM via the opening 12a, and is extended over the upper surface (surface) of the protective film 12. As shown in FIG. 1, the external pad electrode 13 extends to a region outside the rewiring RM (when seen in a plan view). The external pad electrode 13 is provided as a palladium (Pd) film, a stacked film composed of a titanium (Ti) film and a palladium (Pd) film overlaid on the titanium, a gold (Au) film, a platinum (Pt) film, a rhodium (Rh) film, etc. The external pad electrode 13 is formed by, for example, sputtering and has a film thickness of 50 nm to 1 μm. It is important to make the external pad electrode 13 smaller in film thickness than the rewiring RM for performing microfabrication of the external pad electrode 13.

To the external pad electrode 13, for example, the copper (Cu) wire 27 is connected by wire bonding. The wire 27 is about 30 μm in diameter, while the ball portion 27a, which is the connection area between the wire 27 and the external pad electrode 13, is about 60 μm to 80 μm in diameter. The ball connecting portion 13a of the external pad electrode 13, therefore, must be shaped into a rectangular (square) with each side of about 80 μm to 100 μm long. As shown in FIGS. 1 and 2, the ball portion 27a is located completely outside the rewiring RM. The copper wire may be replaced with a gold (Au) wire or a copper wire coated with palladium (Pd) (Pd-coat Cu wire).

FIG. 3 shows layers above the surface protective film 10 of FIG. 2. The base insulating film 11 is disposed on the surface protective film 10, and two rewirings RM are disposed on the upper surface (surface) of the base insulating film 11 such that they extend in parallel with each other. The protective film 12 is disposed on the base insulating film 11 and covers the upper surfaces and side faces of the rewirings RM. On the upper surface (surface) of the protective film 12, the external pad electrode 13 wider than the rewiring RM is disposed, and the wire 27 is connected to the external pad electrode 13.

The external pad electrode 13 wider than the rewiring RM completely covers the top of the rewiring RM (space above the top of the rewiring RM) and reaches a region outside the rewiring RM. The ball portion 27a of the wire 27 connected to the external pad electrode 13 covers the top of the rewiring RM (space above the top of the rewiring RM) and the region outside the rewiring RM.

It is important to use a stress relaxing film in the base insulating film 11 or protective film 12 in order to prevent a case where a crack develops on any one of the semiconductor substrate 1P, the inter-layer insulating films 4, 6, and 8, and the surface protective film 10 due to a stress applied during the wire bonding process for connecting the wire 27 to the external pad electrode 13. For example, a film with a Young's modulus of 6 GPa or less and a thickness of 0.5 μm to 2 μm is used as the base insulating film 11 or the protective film 12. For example, a film with a Young's modulus of 6 GPa or less and a thickness of 0.5 μm to 2 μm is used as the base insulating film 11, the protective film 12 is provided as a film with a thickness that ensures insulation (electrical isolation) between the rewirings RM adjacent to each other and insulation (electrical isolation) between the rewiring RM and the external pad electrode 13.

If the base insulating film 11 is omitted, it is essential to use a film with a Young's modulus of 6 GPa or less and a thickness of 0.5 μm to 2 μm, as the protective film 12. In such a case, it is important that the protective film 12 has its thickness of 0.5 μm to 2 μm above the rewiring RM. The thickness of the protective film 12 is determined to be 2 μm or less so as to prevent the step-caused breakage (discontinuation, wire-breaking) of the external pad electrode 13 extending continuously from the upper surface of the rewiring RM onto the upper surface of the protective film 12 via the external pad opening 12a. Examinations by the inventors have confirmed that using a film with a Young's modulus of 6 GPa or less and a thickness of 0.5 μm or more prevents crack formation on any one of the semiconductor substrate 1P made of silicon, the inter-layer insulating films 4, 6, and 8, and the surface protective film 10, in the wire bonding process.

In the region between the two rewirings RM adjacent to each other, as shown in FIG. 3, a dent may be formed on the upper surface of the protective film 12 and the ball portion 27a may be on this dent. It has been confirmed that in such a case, determining the depth from the surface of the protective film 12 on top of the rewiring RM to the bottom of the dent to be 2.0 μm or less ensures stable connection of the ball portion 27a to the external pad electrode 13.

<Characteristics of Semiconductor Device>

The major characteristics of the semiconductor device 1A according to the present embodiment will hereinafter be described.

The semiconductor device 1A is structured such that the rewiring RM and the external pad electrode 13 are composed of different layers of metal films, respectively, and that the wire 27 is connected to the external pad electrode 13. In this structure, the external pad electrode 13 can be disposed also above a rewiring located outside or adjacent to the rewiring RM. This improves a degree of freedom in disposing the external pad electrode 13, thus enabling high-density integration of the semiconductor device 1A. High-density integration of the semiconductor device 1A leads to realization of a reduction in its power consumption and an increase in its operation speed.

The semiconductor device 1A is structured such that the rewiring RM and the external pad electrode 13 are composed of different layers of metal films, respectively, and that the wire 27 is connected to the external pad electrode 13, which is provided as a film thinner than the rewiring RM. In this structure, external pad electrodes 13 adjacent to each other can be disposed close to each other. This case, different from the case of connecting the wire 27 to the rewiring RM, allows high-density integration of the semiconductor device 1A.

The cap metal film CM is interposed between the rewiring RM and the external pad electrode 13. This prevents oxidization of the rewiring RM in the external pad opening 12a, thus preventing the external dad electrode 13 from separating from the rewiring RM.

<Manufacturing Method for Semiconductor Device>

A manufacturing method for the semiconductor device 1A according to the present embodiment will then be described with focus put on a manufacturing method for the rewiring which is characteristic according to the present embodiment. The manufacturing method for the rewiring corresponds to the cross-sectional view of FIG. 2.

Figure 4:
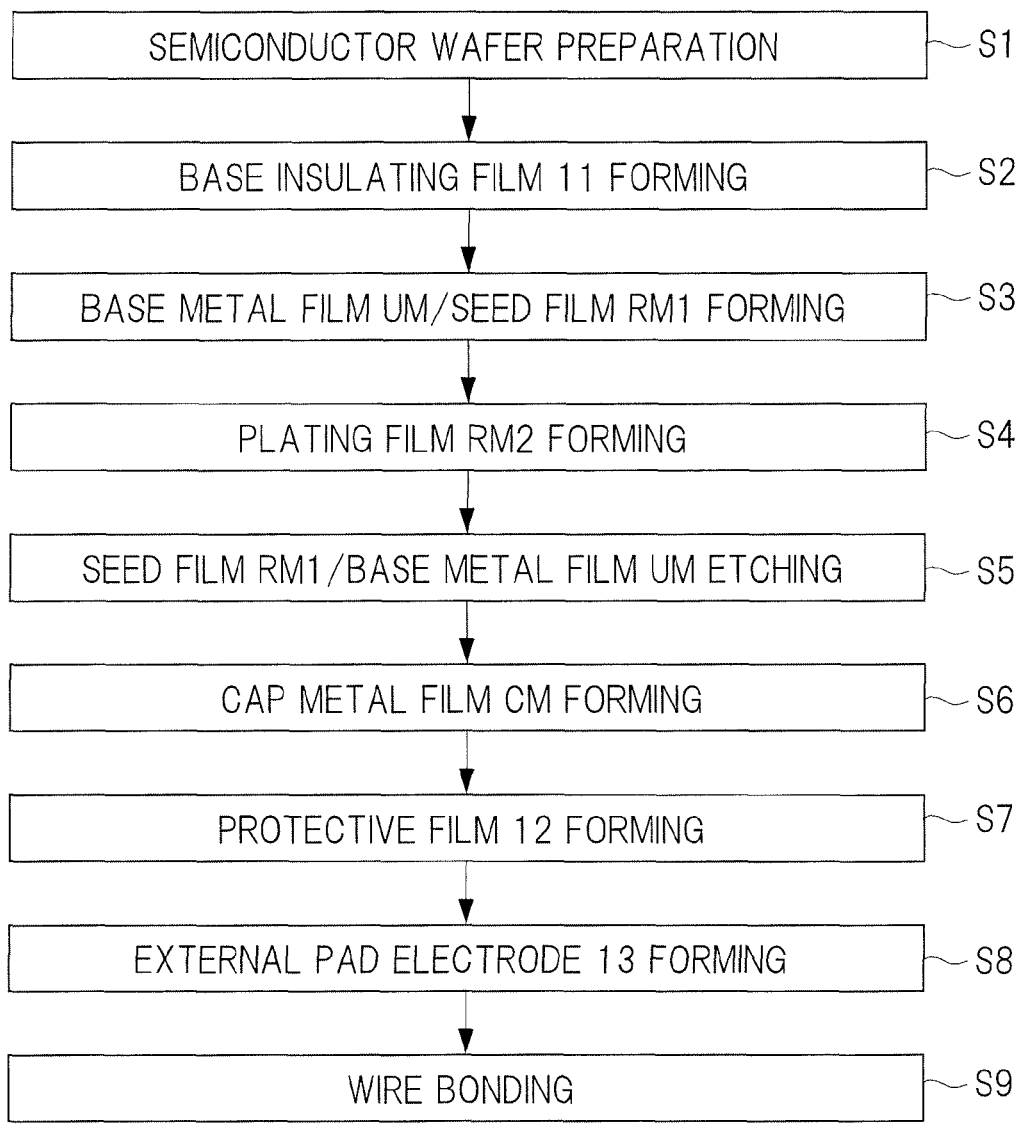
FIG. 4 is a process flowchart showing part of a manufacturing process for the semiconductor device according to the embodiment.

FIG. 4 is a process flow chart showing part of a manufacturing process for the semiconductor device according to the present embodiment. FIGS. 5 to 10 are cross-sectional views of main parts of the semiconductor device according to the present embodiment during the manufacturing process.

Figure 5:
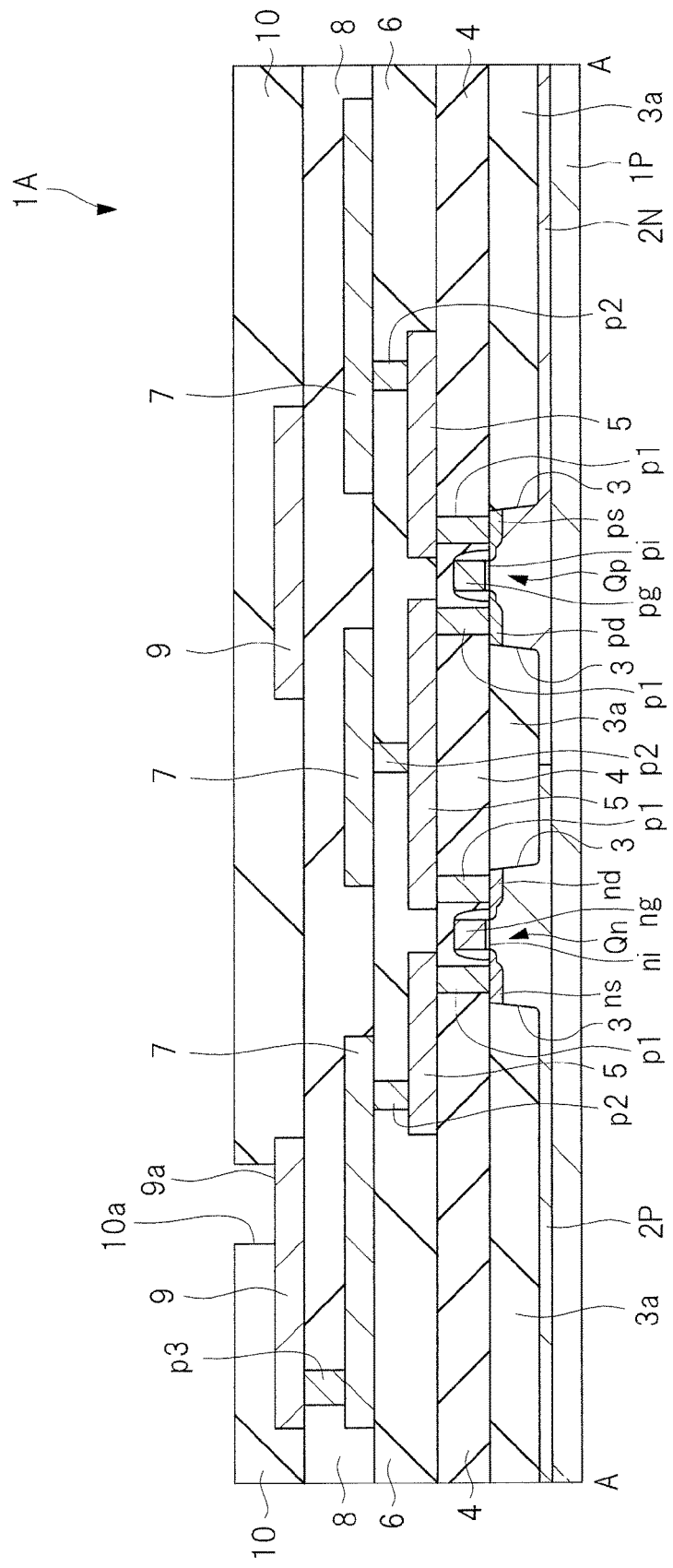
FIG. 5 is a cross-sectional view of main parts of the semiconductor device according to the embodiment during the manufacturing process.

FIG. 5 corresponds to "semiconductor wafer preparation step S1" of the process flow chart of FIG. 4. A semiconductor wafer includes a number of semiconductor device 1A forming areas disposed into a matrix formation. In each of the semiconductor device 1A forming areas, the n-channel type MISFET Qn, the p-channel type MISFET Qp, the plurality of layers of wirings 5, 7, and 9, the inter-layer insulating films 4, 6, and 8, and the surface protective film 10 are formed on the semiconductor substrate 1P. The semiconductor wafer as such is prepared.

Figure 6:
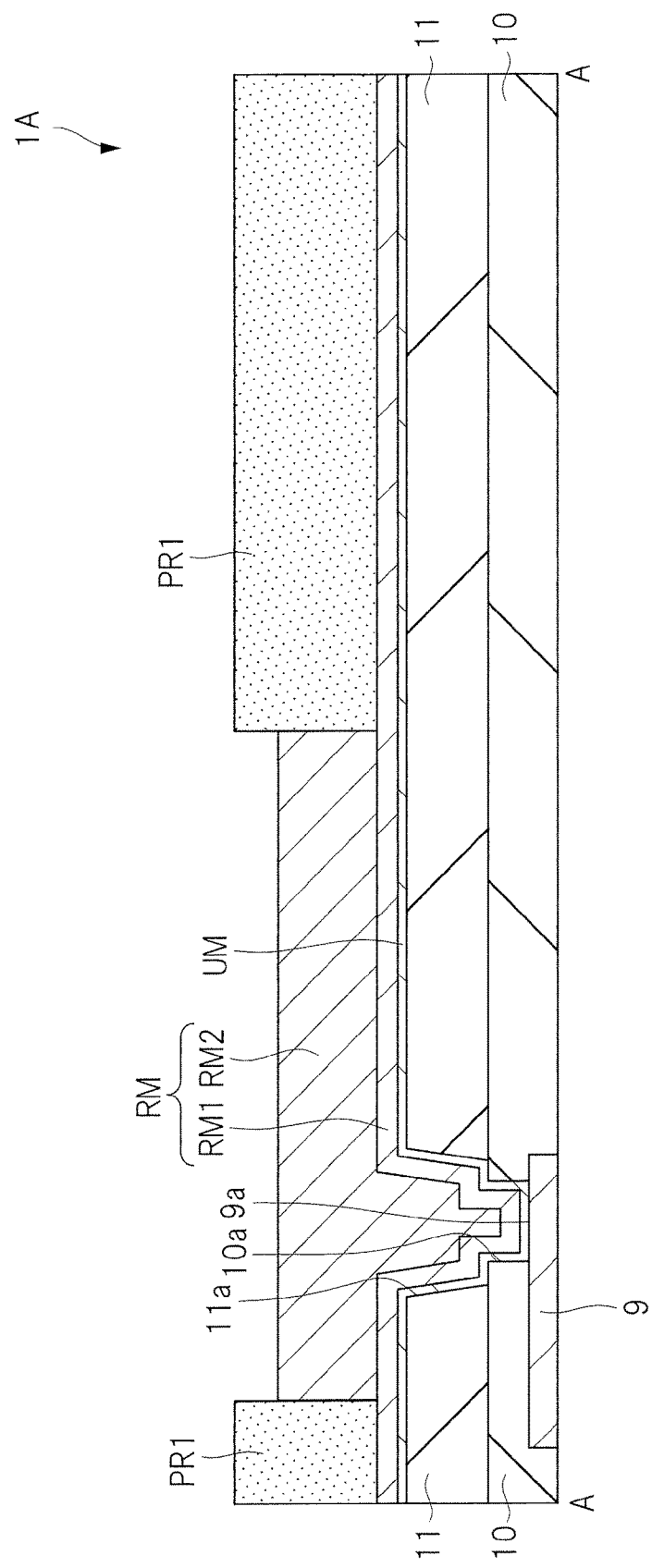
FIG. 6 is a cross-sectional view of main parts of the semiconductor device during the manufacturing process following FIG. 5.

FIG. 6 corresponds to "base insulating film 11 forming step S2", "base metal film UM/seed film RM1 forming step S3", and "plating film RM2 forming step S4" of the process flow chart of FIG. 4.

First, on the surface protective film 10 having the pad opening 10a exposing the pad electrode 9a, the base insulating film 11 is formed, which has the opening 11a exposing the pad electrode 9a and larger than the pad opening 10a. Subsequently, the base metal film UM is formed, which is in contact with the pad electrode 9a and extends from the pad electrode 9a through the pad opening 10a and opening 11a to the upper surface (surface) of the base insulating film 11. The base metal film UM is formed by sputtering or CVD (Chemical Vapor Deposition). The seed film RM1 is then formed by sputtering or CVD such that it covers the upper surface of the base metal film UM. The seed film RM1 is made of copper (Cu) but may contain an additive, such as aluminum (Al).

Subsequently, a rewiring RM forming region is exposed and a photoresist film PR1 covering a region outside the rewiring RM is formed. Then, the plating film RM2 is formed on the surface of the seed film RM1 exposed from the photoresist film PR1, by electrolytic plating (electroplating) using the base metal film UM and the seed film RM1 as electrodes.

Figure 7:
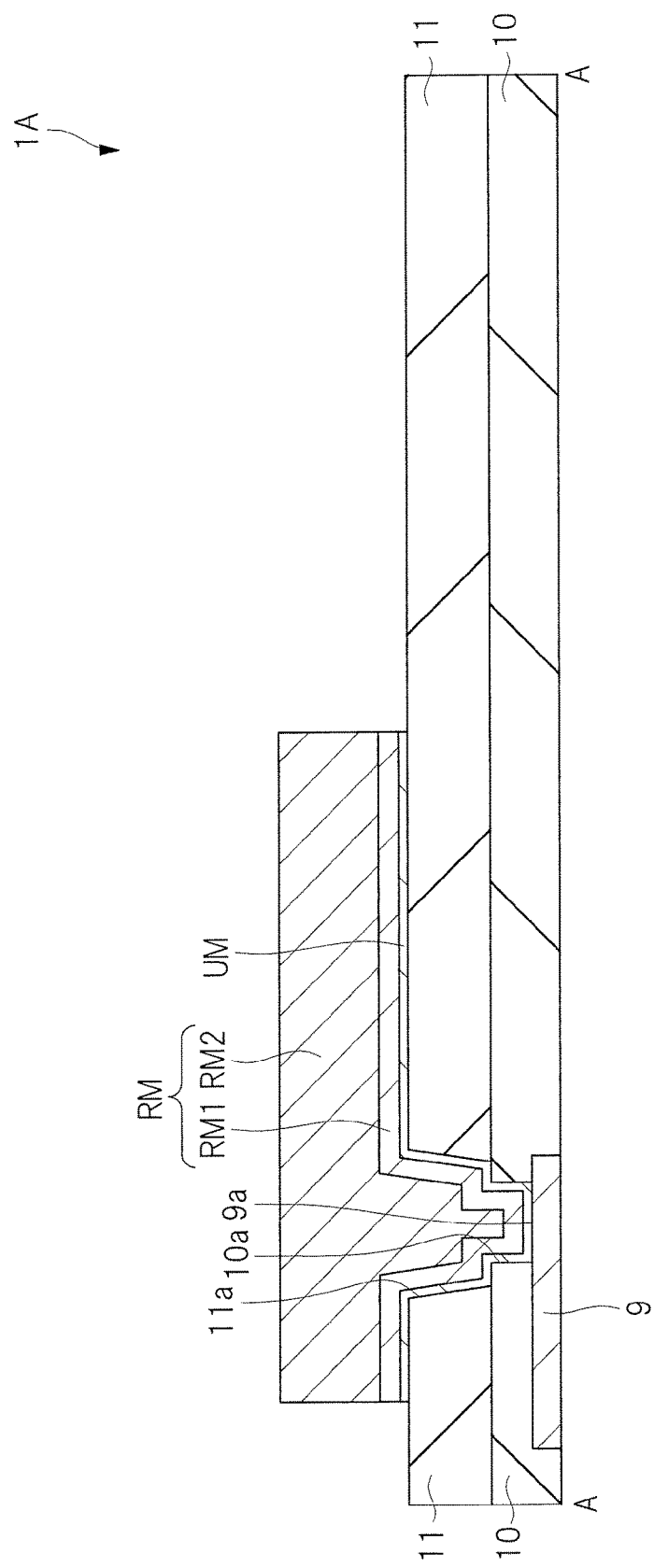
FIG. 7 is a cross-sectional view of main parts of the semiconductor device during the manufacturing process following FIG. 6.

FIG. 7 corresponds to "seed film RM/base metal film UM etching step S5" of the process flow chart of FIG. 4. Following the formation of the plating film RM2, the resist mask PR1 is eliminated. Subsequently, the portion of seed film RM1 that is exposed in a region outside the plating film RM2 is eliminated to leave the patterned seed film RM1 having the same plane pattern as that of the plating film RM2, under the plating film RM2. At this step, the rewiring RM having a first plane pattern P1 and structured as a stack of the seed film RM1 and the plating film RM2 is formed. The portion of base metal film UM that is exposed in the region outside the plating film RM2 is also eliminated in succession to leave the patterned base metal film UM having the same plane pattern as that of the plating film RM2.

Figure 8:
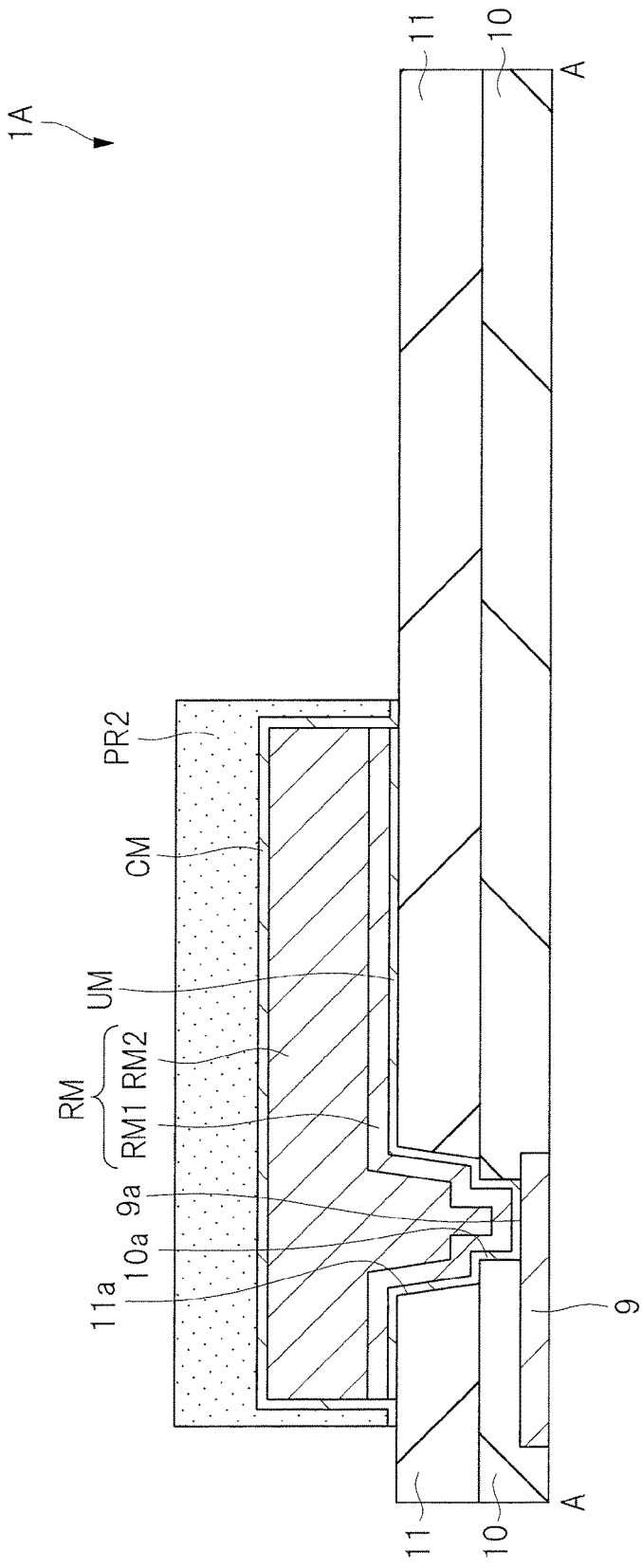
FIG. 8 is a cross-sectional view of main parts of the semiconductor device during the manufacturing process following FIG. 7.

FIG. 8 corresponds to "cap metal film CM forming step S6" of the process flow chart of FIG. 4. The cap metal film CM is formed such that it covers the upper surface and side faces of the plating film RM2, the side faces of the seed film RM1, the side faces of the base metal film UM, and the upper surface of the base insulating film 11 and that it is in contact with the upper surface and side faces of the plating film RM2, the side faces of the seed film RM1, and the side faces of the base metal film UM. The cap metal film CM is formed by sputtering or CVD. The cap metal film CM is then etched, using a photoresist film PR2 completely covering the rewiring RM and having a pattern equivalent to an enlarged pattern of the rewiring RM when seen in a plan view, as a mask, and thus to form the patterned cap metal film CM.

Figure 9:
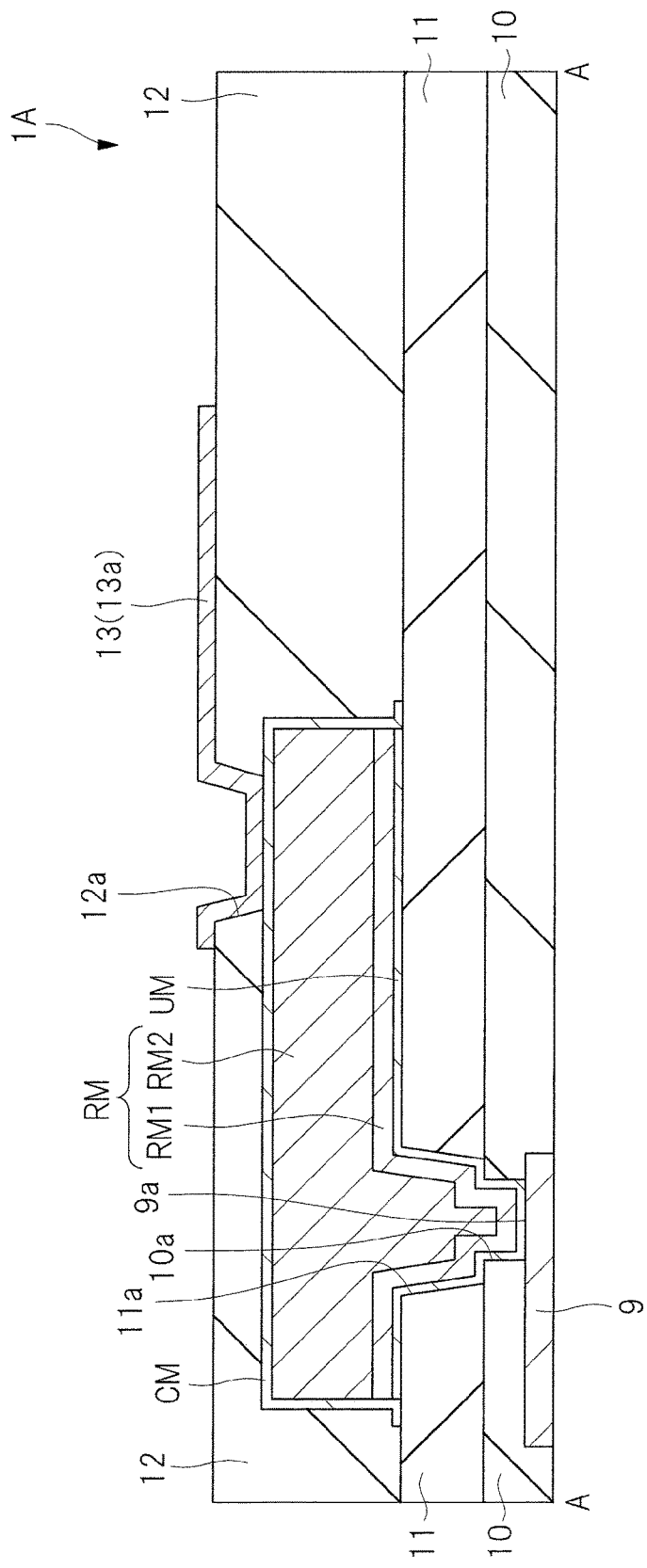
FIG. 9 is a cross-sectional view of main parts of the semiconductor device during the manufacturing process following FIG. 8.

FIG. 9 corresponds to "protective film 12 forming step S7" and "external pad electrode 13 forming step S8" of the process flow chart of FIG. 4. The protective film 12 is formed such that it covers the upper surface and side faces of the rewiring RM that are capped with the cap metal film CM. The protective film 12 has the opening 12a exposing part of the upper surface of the rewiring RM (cap metal film CM covering the rewiring RM). The opening 12a is formed by the known photolithographic technique or photolithographic technique and etching technique. For example, when the protective film 12 is formed by a photosensitive polyimide film, the opening 12a can be formed using the photolithographic technique only. The rewiring RM is coated with a photosensitive polyimide, which is exposed to light to form the opening 12a exposing the upper surface of the rewiring RM and then is cured (baked). Subsequently, the external pad electrode 13 is formed, which extends over the upper surface of the protective film 12 and is electrically connected to the rewiring RM through the opening 12a. The external pad electrode 13 is formed by patterning a metal film deposited by sputtering, using the known photolithographic technique and etching technique.

Figure 10:
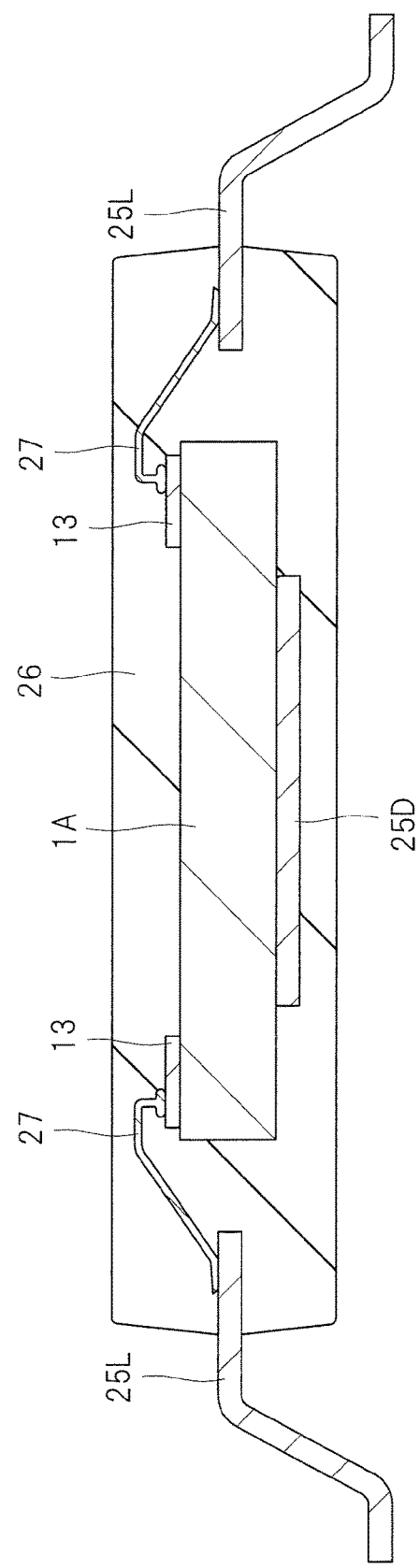
FIG. 10 is a cross-sectional view of main parts of the semiconductor device during the manufacturing process following FIG. 9.

FIG. 10 corresponds to "bonding step S9" of the process flow chart of FIG. 4. Following the end of "external pad electrode 13 forming step S8", the semiconductor wafer is subjected to a dicing process to obtain the semiconductor device 1A. The semiconductor device 1A is mounted on a die pad 25D and is subjected to a wire bonding process by which the external pad electrodes 13 are connected to leads 25L via the wires 27. Subsequently, part of the leads 25L (inner lead portions), the die pad 25D, the semiconductor chip (device) 1A, and the wires 27 are sealed with a sealing material (sealing resin) 26. Hence the sealed semiconductor device 1A is completed. The sealed semiconductor device 1A may also be simply referred to as a semiconductor device (semiconductor integrated circuit device).

As shown in FIG. 10, the semiconductor device 1A having the plurality of external pad electrodes 13 is mounted on the die pad 25D and electrically connected to the plurality of leads 25L via the wires 27. Part of the leads 25L (inner lead portions), the die pad 25D, the semiconductor chip (device) 1A, and the wires 27 are sealed with the sealing material (sealing resin) 26, which is, for example, a thermosetting epoxy resin.

<Characteristics of Manufacturing Method for Semiconductor Device>

The major characteristics of the manufacturing method for the semiconductor device 1A according to the present embodiment will hereinafter be described.

At "protective film 12 forming step S7" of FIG. 4, if the rewiring RM composed of a copper (Cu) film is not capped with the cap metal film CM when the protective film 12 having the opening 12a is formed on the rewiring RM, the surface of the copper (Cu) film exposed from the opening 12a is oxidized, which deteriorates the adhesion of the rewiring RM to the external pad electrode 13, thus causing the external pad electrode 13 to separate from the rewiring RM. This is a confirmed case. According to the manufacturing method of the present embodiment, however, the rewiring RM composed of the copper (Cu) film is capped with the cap metal film CM. This prevents the separation of the external pad electrode 13, thereby improves the manufacturing yield of the semiconductor device 1A and reduces manufacturing costs.

When a photosensitive polyimide film is used as the protective film 12, it does not brings a concern that the surface of the copper (Cu) film making up the rewiring RM is oxidized during the curing (baking) of the photosensitive polyimide film. The separation of the external pad electrode 13 is, therefore, prevented.

The stress relaxing films are formed under the external pad electrode 13 extending into the region outside the rewiring RM. As a result, in the wire bonding process by which the wire 27 is connected to the external pad electrode 13, crack formation on the semiconductor substrate 1P, the inter-layer insulating films 4, 6, and 8, or the surface protective film 10 is prevented. This improves the reliability of the semiconductor device 1A.

Because the rewiring RM and external pad electrode 13 are provided with the stress relaxing films in the above manner, even if no stress relaxing film is present under the rewiring RM, crack formation on the semiconductor substrate 1P, the inter-layer insulating films 4, 6, and 8, or the surface protective film 10 is prevented during the wire bonding process.

First Modification Example

Figure 11:
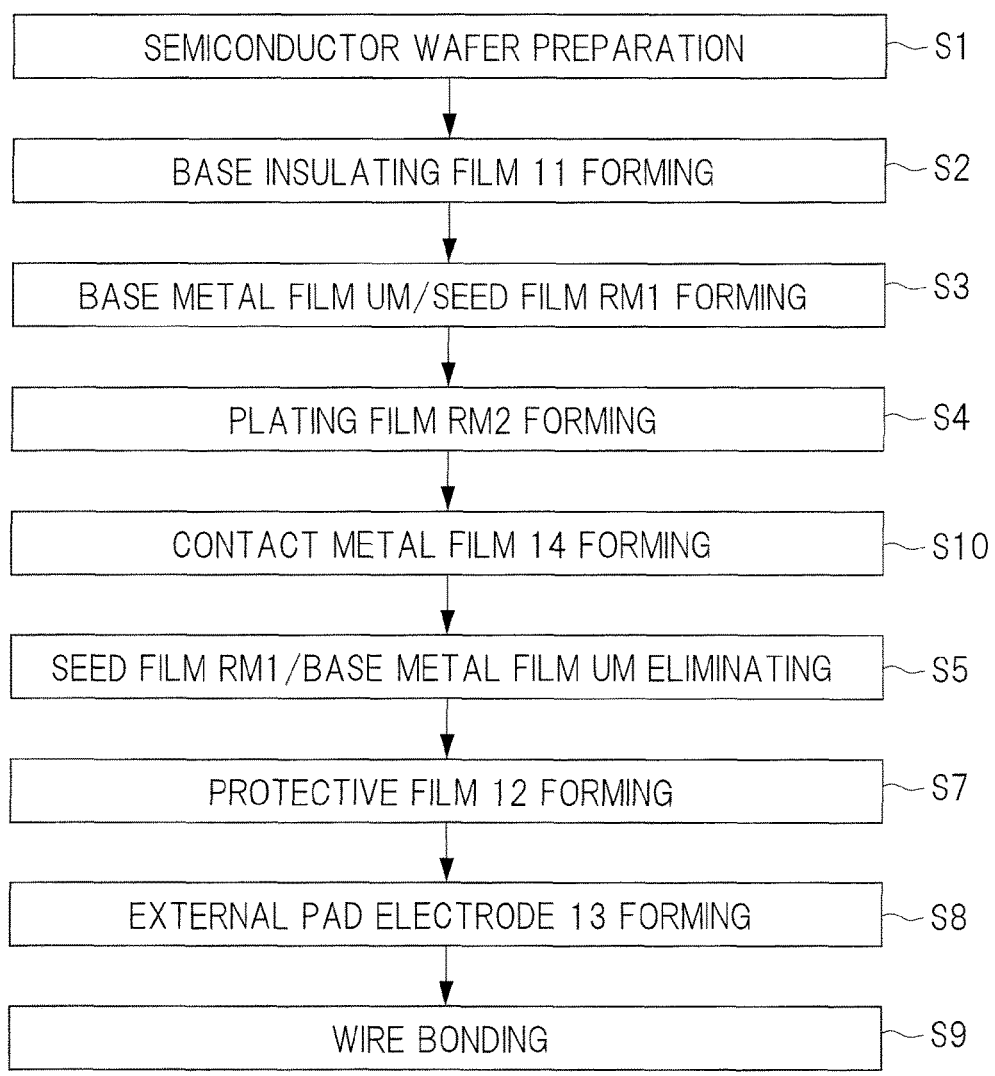
FIG. 11 is a process flowchart showing part of a manufacturing process for a semiconductor device that is a first modification example.
Figure 12:
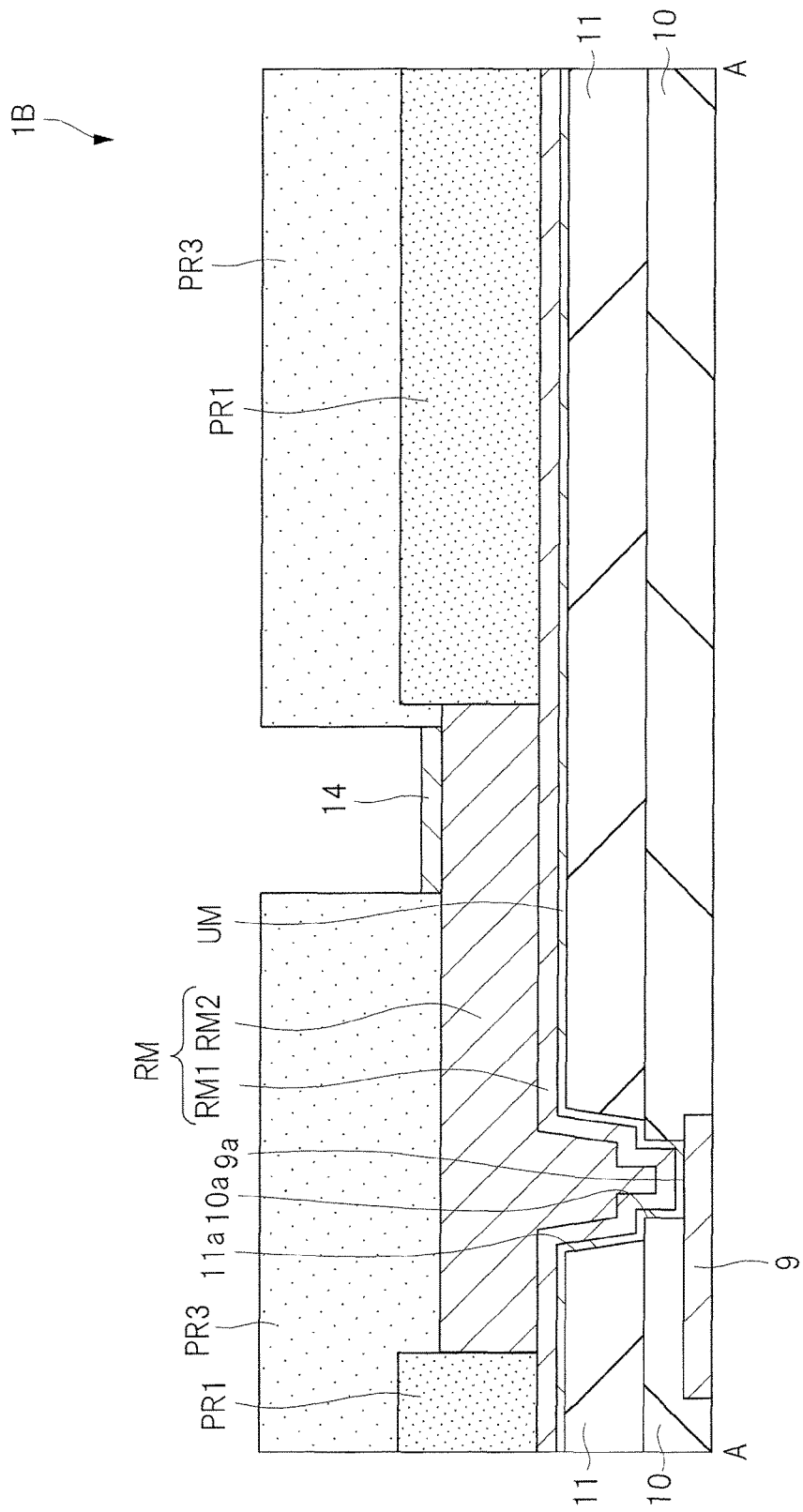
FIG. 12 is a cross-sectional view of main parts of the semiconductor device that is the first modification example during the manufacturing process.
Figure 13:
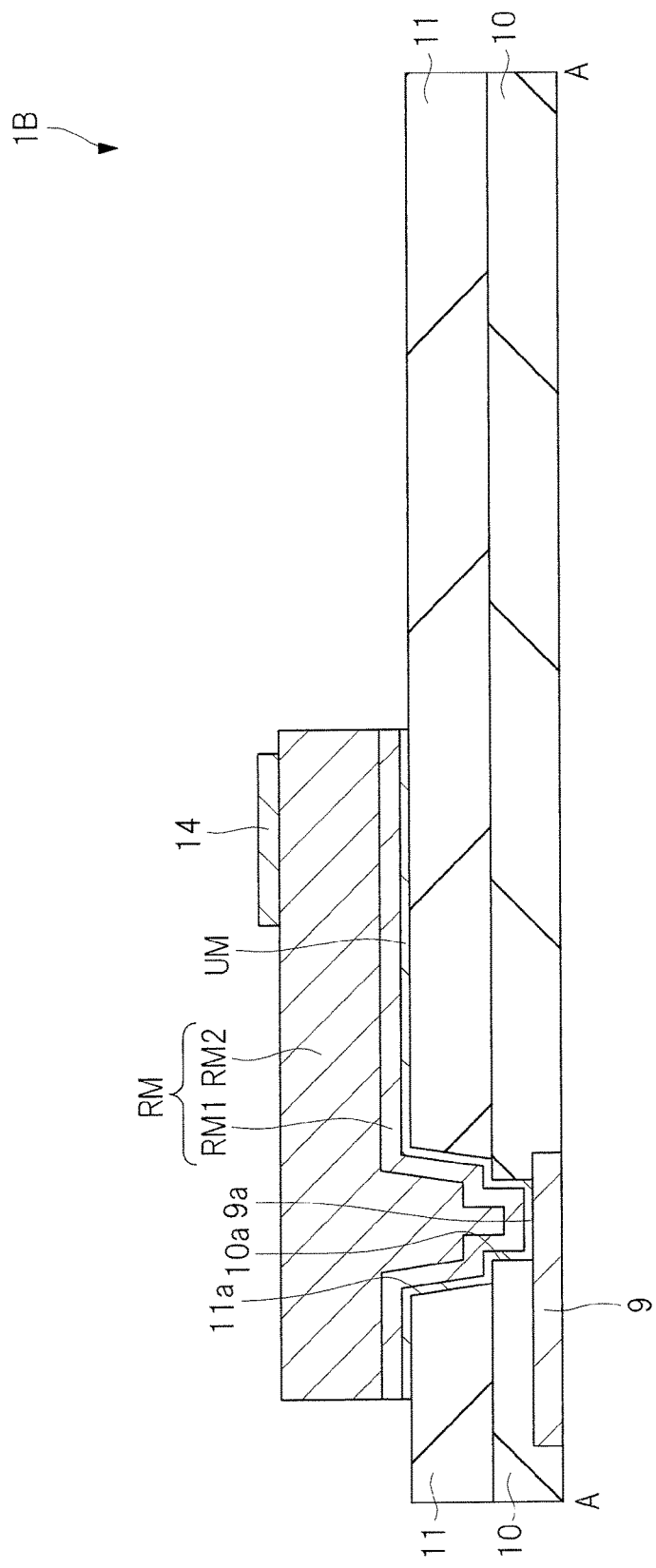
FIG. 13 is a cross-sectional view of main parts of the semiconductor device during the manufacturing process following FIG. 12.
Figure 14:
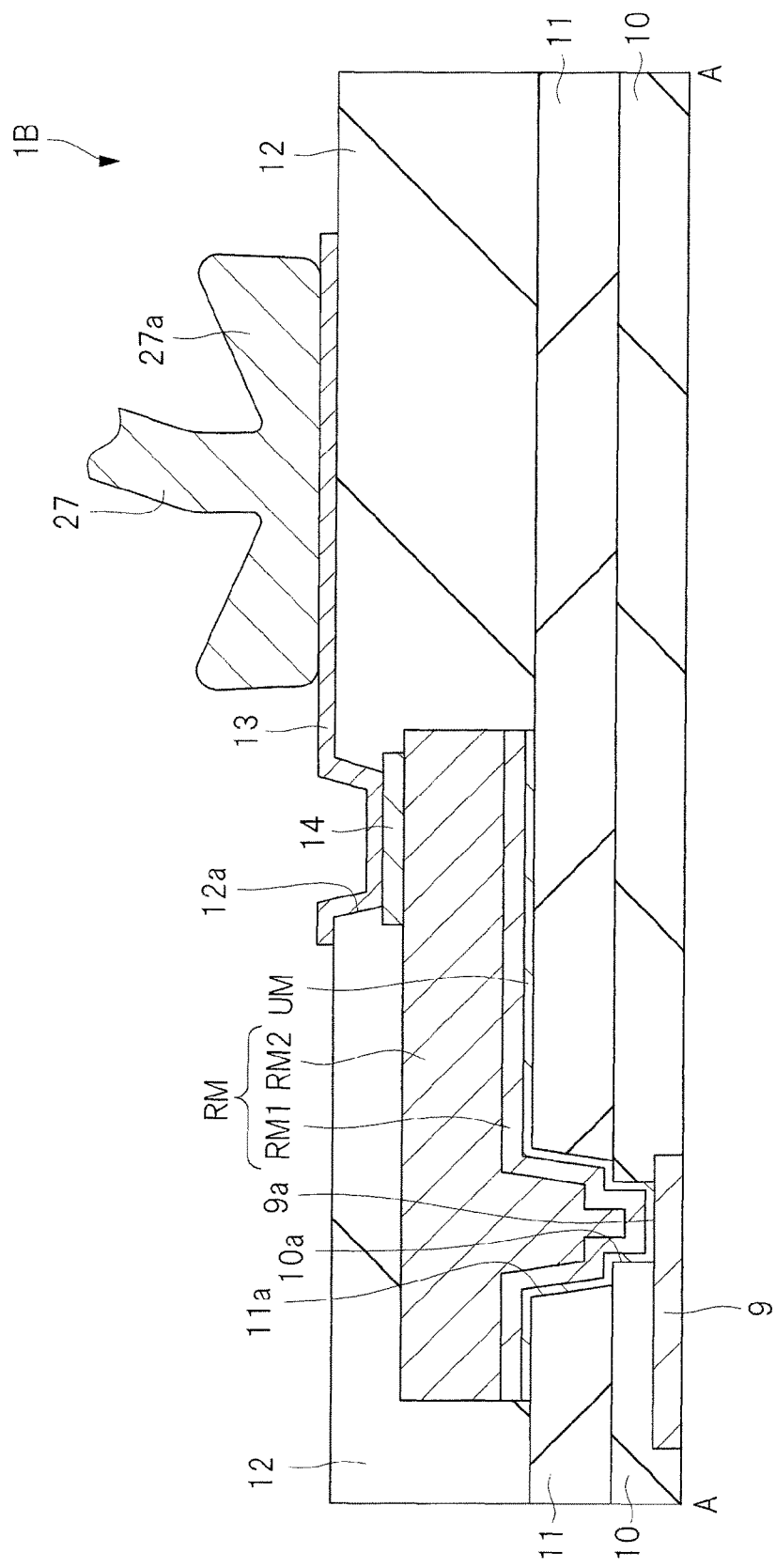
FIG. 14 is a cross-sectional view of main parts of the semiconductor device during the manufacturing process following FIG. 13.

FIG. 11 is a process flowchart showing part of a manufacturing process for a semiconductor device that is a first modification example of the semiconductor device according to the present embodiment. FIGS. 12 to 14 are cross-sectional views of the main parts of the semiconductor device of the first modification example during the manufacturing process. The semiconductor device of the first modification example is referred to as a semiconductor device 1B in order to distinguish it from the semiconductor device 1A according to the present embodiment. However, the same components of the semiconductor device 1B as the components of the semiconductor device 1A according to the present embodiment are denoted by the same reference numerals and are omitted in the further description.

The process flow chart of FIG. 11 is different from the process flow chart of FIG. 4 in that the process flow chart of FIG. 11 further includes "contact metal film 14 forming step S10" placed between "plating film RM2 forming step S4" and "seed film RM1/base metal film UM eliminating step S5", and in that "cap metal film CM forming step S6" is deleted from the process flow chart of FIG. 11.

FIG. 12 indicates a step following "plating film RM2 forming step S4". At this step, as the photoresist film PR1 is left as it is, a photoresist film PR3 having the region corresponding to the opening 12a exposed is formed over the photoresist film PR1 and plating film RM2. Then, a contact metal film 14, which is a plating film, is formed on the surface of plating film RM2 that is exposed from the photoresist film PR3, by electrolytic plating using the base metal film UM and seed film RM1 as electrodes. The contact metal film 14 is provided as a titanium (Ti) film, etc.

FIG. 13 corresponds to "seed film RM1/base metal film UM eliminating step S5" of the process flow chart of FIG. 11. This step is the same as "seed film RM1/base metal film UM etching step S5" of FIG. 4 and is therefore omitted in the further description. On the upper surface of the rewiring RM, the contact metal film 14 is formed to occupy part of the upper surface.

FIG. 14 corresponds to "protective film 12 forming step S7", "external pad electrode 13 forming step S8", and "wire bonding step S9" of the process flow chart of FIG. 11. These steps are the same as steps S7 to S9 of FIG. 4. The contact metal film 14 is formed to be wider (larger) than the opening 12a, so that the upper surface of the rewiring RM is not exposed when the opening 12a is formed on the protective film 12.

According to the manufacturing method of the first modification example, the contact metal film 14 is formed on the upper surface of the rewiring RM composed of the copper (Cu) film. This prevents the separation of the external pad electrode 13, thereby improves the manufacturing yield of the semiconductor device 1B and reduces manufacturing costs.

If the whole upper surface of the rewiring RM is coated with a titanium (Ti) film, an area occupied by the titanium (Ti) film in the semiconductor wafer increases, leading to a warp of the semiconductor wafer. This is a confirmed problem. According to the first modification example, the contact metal film 14 provided as the titanium (Ti) film is formed only in the contact area between the rewiring RM and the external pad electrode 13. As a result, the warp of the semiconductor wafer is prevented.

Second Modification Example

Figure 15:
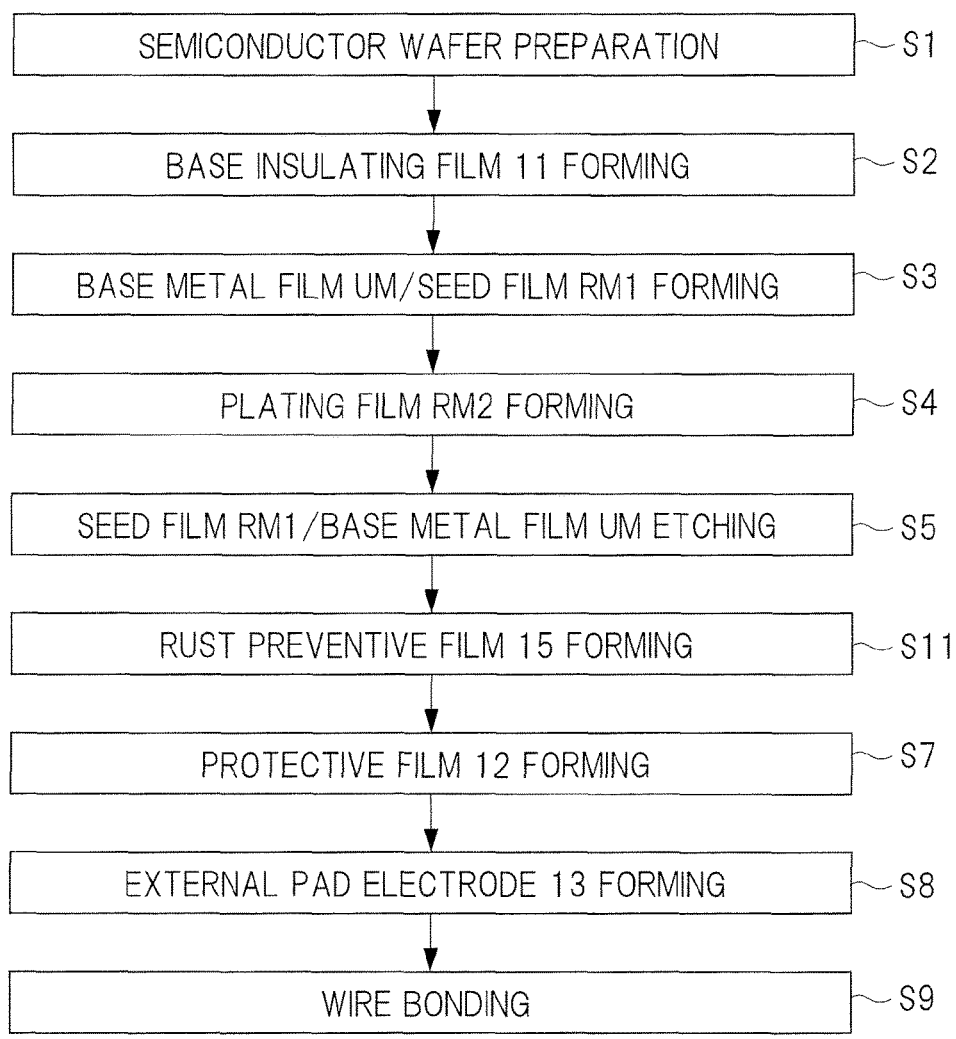
FIG. 15 is a process flowchart showing part of a manufacturing process for a semiconductor device that is a second modification example.
Figure 16:
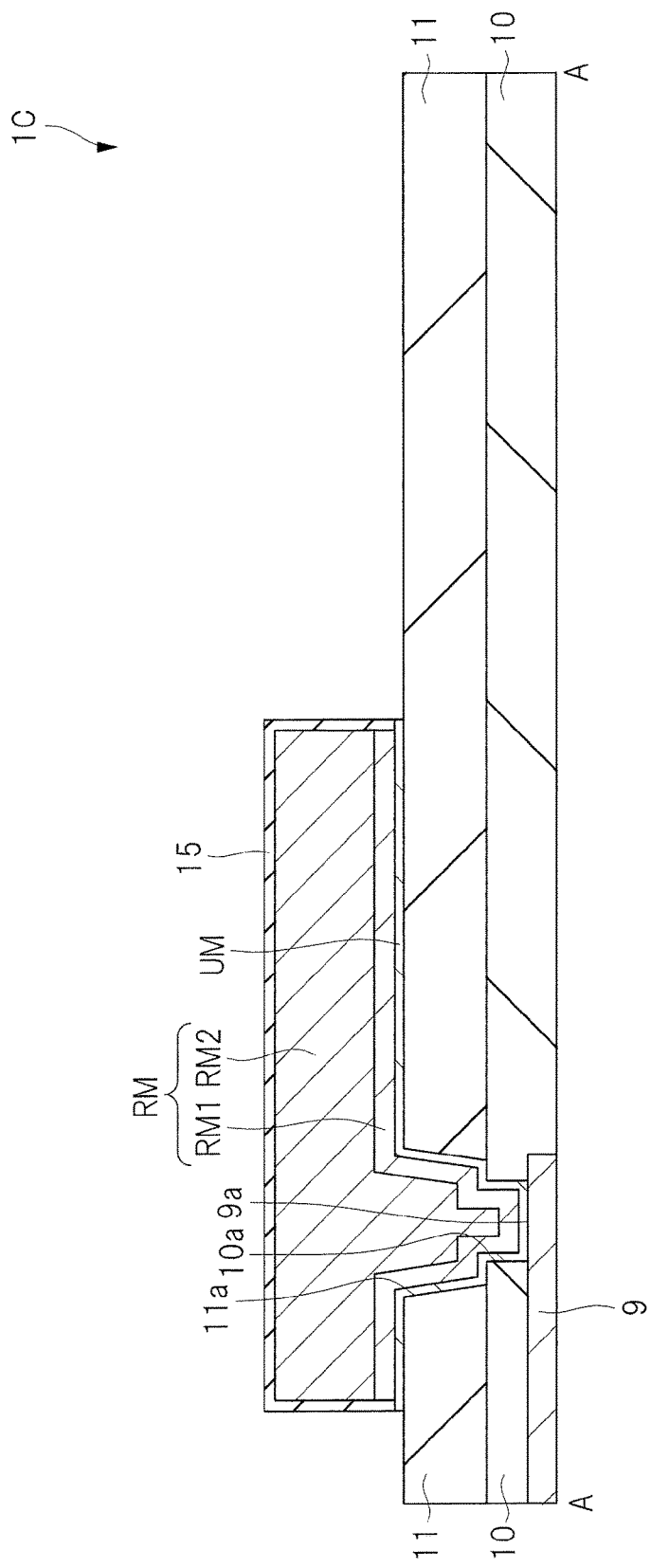
FIG. 16 is a cross-sectional view of main parts of the semiconductor device that is the second modification example during the manufacturing process.
Figure 17:
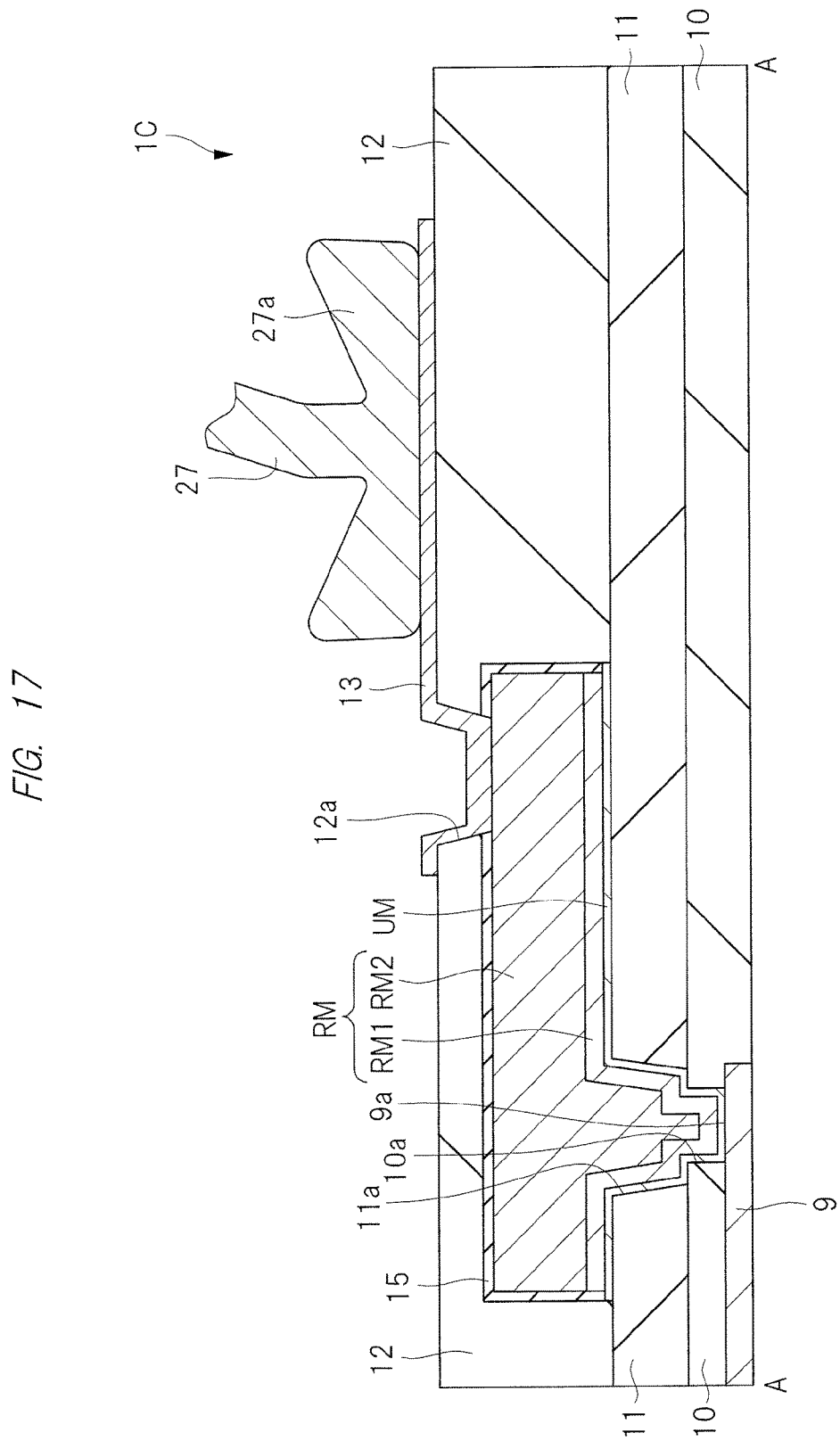
FIG. 17 is a cross-sectional view of main parts of the semiconductor device during the manufacturing process following FIG. 16.

FIG. 15 is a process flowchart showing part of a manufacturing process for a semiconductor device that is a second modification example of the semiconductor device according to the present embodiment. FIGS. 16 and 17 are cross-sectional views of the main parts of the semiconductor device of the second modification example during the manufacturing process. The semiconductor device of the second modification example is referred to as a semiconductor device 1C in order to distinguish it from the semiconductor device 1A according to the present embodiment. However, the same components of the semiconductor device 1C as the components of the semiconductor device 1A according to the present embodiment are denoted by the same reference numerals and are omitted in the further description.

The process flow chart of FIG. 15 is different from the process flow chart of FIG. 4 in that "cap metal film CM forming step S6" is replaced with "rust preventive film 15 forming step S11".

FIG. 16 corresponds to "rust preventive film 15 forming step S11" of the process flow chart of FIG. 15. Following "seed film RM1/base metal film UM etching step S5", the rewiring RM is subjected to a rust preventing process by which a rust preventive film 15 is formed on the upper surface and side faces of the rewiring RM. The rust preventing process is performed in such a way that for example, by coating the upper surface and side faces of the rewiring RM with an insulating film made of a benzotriazole-based compound, the rust preventive film 15 is formed selectively on the upper surface and side faces of the rewiring RM without being formed on the upper surface of the base insulating film 11.

FIG. 17 corresponds to "protective film 12 forming step S7", "external pad electrode 13 forming step S8", and "wire bonding step S9" of the process flow chart of FIG. 15. These steps are the same as steps S7 to S9 of FIG. 4. However, it is necessary that after the opening 12a is formed on the protective film 12 at the protective film 12 forming step, the rust preventive film 15 exposed from the opening 12a be eliminated by wet etching, etc., and then the external pad electrode 13 be formed.

When a photosensitive polyimide film is used as the protective film 12, because the rewiring RM is covered with the rust preventive film 15, it does not brings a concern that the surface of the copper (Cu) film making up the rewiring RM is oxidized during the curing (baking) of the photosensitive polyimide film. The separation of the external pad electrode 13 is, therefore, prevented.

Third Modification Example

Figure 18:
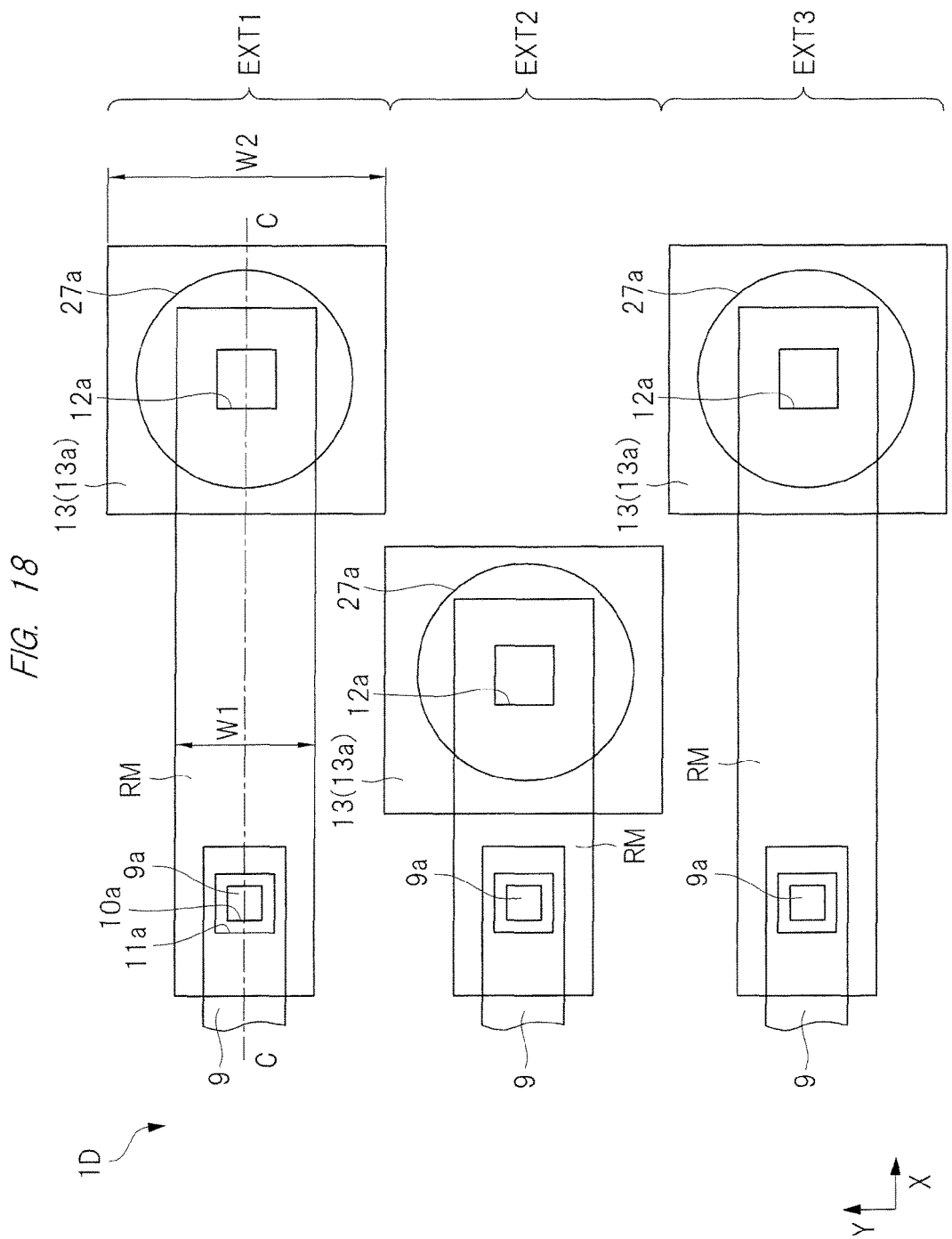
FIG. 18 is a plan view of the main parts of a semiconductor device that is a third modification example.
Figure 19:
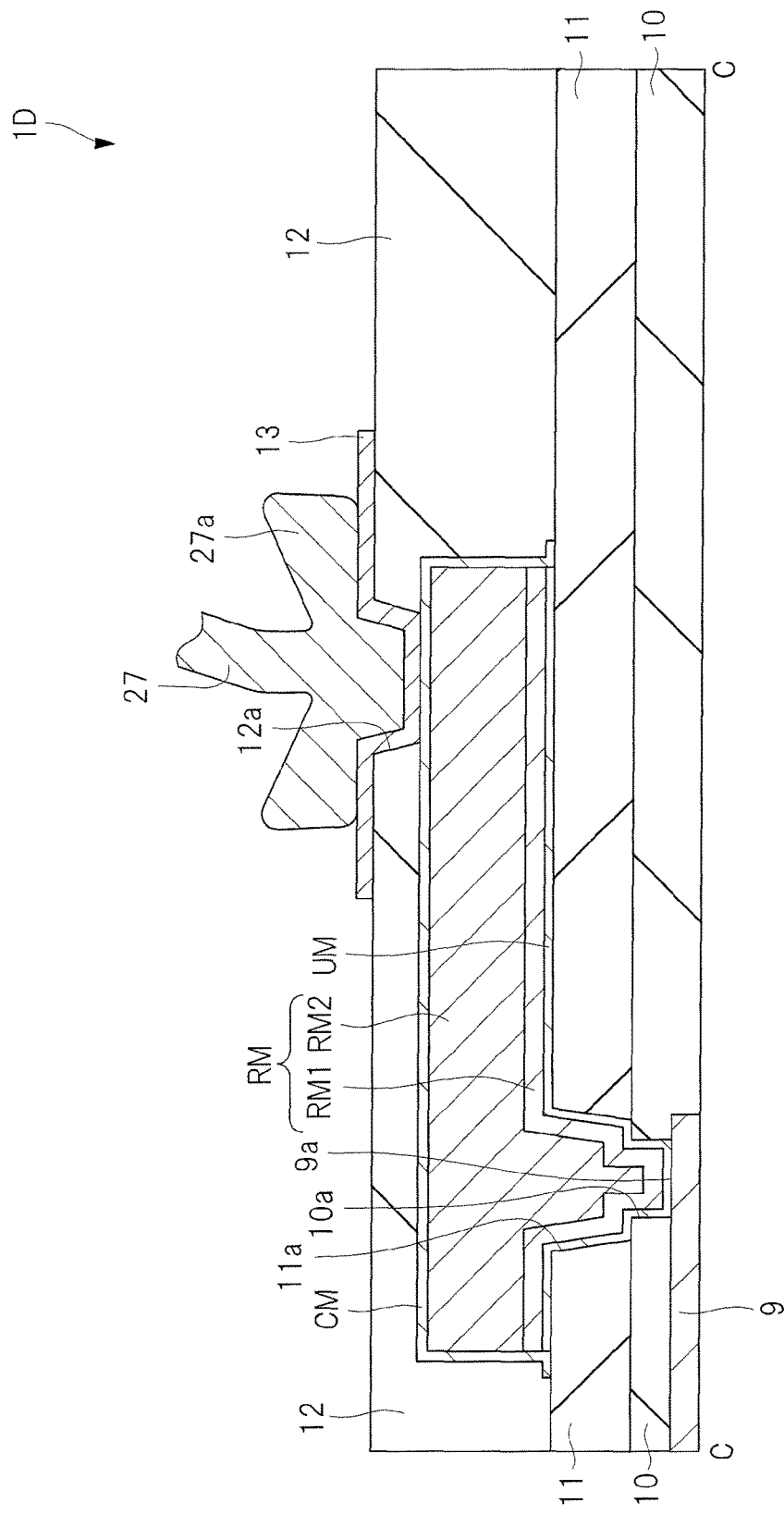
FIG. 19 is a cross-sectional view of main parts that is taken along a C-C line of FIG. 18.

FIG. 18 is a plan view of the main parts of a semiconductor device that is a third modification example of the semiconductor device according to the present embodiment. FIG. 19 is a cross-sectional view of the main parts taken along a C-C line of FIG. 18. The semiconductor device of the third modification example is referred to as a semiconductor device 1D in order to distinguish it from the semiconductor device 1A according to the present embodiment. However, the same components of the semiconductor device 1D as the components of the semiconductor device 1A according to the present embodiment are denoted by the same reference numerals and are omitted in the further description.

As shown in FIGS. 18 and 19, the ball portion 27a of the wire 27 is disposed right above the opening 12a of the protective film 12 such that the ball portion 27a covers the opening 12a. It is understood by comparing FIGS. 18 and 19 with the plan view of FIG. 1 that the external pad electrode 13 of FIG. 18 is composed of the ball connecting portion 13a only and has no projecting portion 13b.

According to the third modification example, the base insulating film 11 serves as a stress relaxing film, and is provided as an organic film with a Young's modulus of 6 GPa or less and a thickness of 0.5 μm or more. Because the base insulating film 11 is always present in a region other than the opening 11a, the external pad electrode 13 or the ball portion 27a of the wire 27 may be disposed in any given region provided unless they do not overlap the opening 11a. In other words, the external pad electrode 13 should be disposed in the region that is outside the opening 11a (i.e., that does not overlap the opening 11a) and that overlaps the base insulating film 11.

The base insulating film 11 may be partially disposed in a region overlapping the external pad electrode 13. In such a case, the size of the base insulating film 11 should be larger than that of the external pad electrode 13 when seen in a plan view, and the whole of the external pad electrode 13 should be located inside the base insulating film 11.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the present embodiment including the first to third modification examples is described as an example in which the wire is connected to the external pad electrode. However, a bump, such as solder (or gold) ball, may be connected in place of the wire, to the external pad electrode.

What is claimed is:

1. A semiconductor device comprising:
   a semiconductor substrate;
   a plurality of wiring layers formed over the semiconductor substrate;
   a pad electrode being part of an uppermost wiring layer among the plurality of wiring layers;
   an insulating film formed over the uppermost wiring layer and having a first opening above the pad electrode;
   a rewiring electrically connected to the pad electrode and extending over the insulating film;
   a protective film covering an upper surface of the rewiring and the insulating film, and having a second opening exposing part of the upper surface of the rewiring;
   an external pad electrode electrically connected to the rewiring through the second opening and extending over the protective film; and
   a wire connected to the external pad electrode,
   wherein, in a plan view, part of the external pad electrode is located in a region outside the rewiring.

2. The semiconductor device according to claim 1,
   wherein the wire has a ball portion connected to the external pad electrode, and
   in the plan view, part of the ball portion is located in a region outside the rewiring.

3. The semiconductor device according to claim 2, further comprising:
   an adjacent rewiring formed on the insulating film and disposed adjacent to the rewiring,
   wherein in the plan view, the ball portion overlaps the protective film located between the rewiring and the adjacent rewiring.

4. The semiconductor device according to claim 1,
   wherein the insulating film or the protective film is provided as an organic film.

5. The semiconductor device according to claim 4,
   wherein the organic film has a Young's modulus of 6 GPa or less and a thickness of 0.5 µm or more.

6. The semiconductor device according to claim 5,
   wherein the organic film is a polyimide resin film.

7. The semiconductor device according to claim 1,
   wherein the external pad electrode has a film thickness smaller than that of the rewiring.

8. The semiconductor device according to claim 1,
   wherein the external pad electrode includes:
      a ball connecting portion to which the wire is connected; and
      a projecting portion extending from the ball connecting portion and connected to the rewiring via the second opening, and
   in the plan view, a width of the ball connecting portion is larger than that of the rewiring in a direction perpendicular to an extending direction of the rewiring.

9. The semiconductor device according to claim 1, further comprising a contact metal film disposed between the rewiring and the external pad electrode in the second opening.

10. The semiconductor device according to claim 1, further comprising a cap metal film covering an upper surface and side faces of the rewiring.

11. A manufacturing method for a semiconductor device comprising:
   (a) preparing a semiconductor substrate having a plurality of wiring layers and a pad electrode being part of an uppermost wiring layer among the plurality of wiring layers;
   (b) forming a first insulating film over the uppermost wiring layer and having a first opening above the pad electrode;
   (c) forming a rewiring extending over the first insulating film and electrically connected to the pad electrode through the first opening;
   (d) forming a second insulating film covering an upper surface of the rewiring and the insulating film, and having a second opening exposing part of the upper surface of the rewiring;
   (e) forming an external pad electrode electrically connected to the rewiring through the second opening and extending over the second insulating film; and
   (f) connecting a wire to the external pad electrode,
   wherein the wire has a ball portion connected to the external pad electrode, and
   in a plan view, part of the ball portion is located in a region outside the rewiring.

12. The manufacturing method for a semiconductor device according to claim 11, further comprising:
   (g) forming a contact metal film on part of an upper surface of the rewiring,
   wherein (g) is performed between (c) and (d).

13. The manufacturing method for a semiconductor device according to claim 11, further comprising:
   (h) covering an upper surface and side faces of the rewiring with a cap metal film,
   wherein (h) is performed between (c) and (d).

14. The manufacturing method for a semiconductor device according to claim 11, further comprising:
   (i) covering an upper surface and side faces of the rewiring with an insulating rust preventive film,
   wherein (i) is performed between (c) and (d).

15. The manufacturing method for a semiconductor device according to claim 11,
   wherein the rewiring is formed by plating, while the external pad electrode is formed by sputtering.

16. The semiconductor device according to claim 1, wherein the plurality of wiring layers are stacked in a thickness direction of the semiconductor device, with interlayer insulating films disposed between wiring layers that are adjacent in the thickness direction.

17. The semiconductor device according to claim 1, wherein said part of the external pad electrode that is outside the rewiring contacts the protective film, and the wire is connected to the external pad electrode at said part of the external pad electrode.

18. The semiconductor device according to claim 17, wherein, in the plan view, the second opening does not overlap with said part of the external pad electrode connected to the wire.

19. The manufacturing method for a semiconductor device according to claim 14, further comprising:
prior to (e), removing the rust protective film exposed by the second opening.

* * * * *

UNITED STATES PATENT AND TRADEMARK OFFICE
CERTIFICATE OF CORRECTION

| | | |
|---|---|---|
| PATENT NO. | : 9,576,921 B2 | Page 1 of 1 |
| APPLICATION NO. | : 14/952468 | |
| DATED | : February 21, 2017 | |
| INVENTOR(S) | : Akira Yajima and Seiji Muranaka | |

It is certified that error appears in the above-identified patent and that said Letters Patent is hereby corrected as shown below:

On the Title Page

(56) References Cited - US PATENT DOCUMENTS should include:
2012/0235278 A1 *    9/2012  Shigihara et al.

Signed and Sealed this
Thirtieth Day of May, 2017

Michelle K. Lee
*Director of the United States Patent and Trademark Office*